United States Patent
Kim et al.

(10) Patent No.: US 10,680,636 B2
(45) Date of Patent: Jun. 9, 2020

(54) ANALOG-TO-DIGITAL CONVERTER (ADC) WITH RESET SKIPPING OPERATION AND ANALOG-TO-DIGITAL CONVERSION METHOD

(71) Applicants: SAMSUNG ELECTRONICS CO., LTD., Suwon-si (KR); Korea Advanced Institute of Science and Technology, Daejeon (KR)

(72) Inventors: JongPal Kim, Seoul (KR); Ye Dam Kim, Daejeon (KR); Seung Tak Ryu, Daejeon (KR); Min Jae Seo, Daejeon (KR); Dong Hwan Jin, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/352,501

(22) Filed: Mar. 13, 2019

(65) Prior Publication Data
US 2019/0296760 A1  Sep. 26, 2019

(30) Foreign Application Priority Data

Mar. 26, 2018 (KR) .................. 10-2018-0034596
Dec. 24, 2018 (KR) .................. 10-2018-0168593

(51) Int. Cl.
*H03M 1/66* (2006.01)
*H03M 1/46* (2006.01)
*H03M 1/12* (2006.01)

(52) U.S. Cl.
CPC ......... *H03M 1/468* (2013.01); *H03M 1/1245* (2013.01); *H03M 1/462* (2013.01)

(58) Field of Classification Search
CPC .... H03M 1/468; H03M 1/462; H03M 1/1245; H03M 1/12; H03M 1/00
(Continued)

(56) References Cited

U.S. PATENT DOCUMENTS 7,321,399 B2   1/2008   Rumreich
7,327,994 B2   2/2008   Rafati
(Continued)

FOREIGN PATENT DOCUMENTS

CN   106992781 A   7/2017
JP   2006-108893 A   4/2006
(Continued)

OTHER PUBLICATIONS

Tai, Hung-Yen et al., "11.2 A 0.85fJ/conversion-step 10b 200kS/s subranging SAR ADC in 40nm CMOS", *2014 IEEE International Solid-State Circuits Conference Digest of Technical Papers (ISSCC)*, 2014 (3 pages in English).
(Continued)

Primary Examiner — Jean B Jeanglaude
(74) Attorney, Agent, or Firm — NSIP Law

(57) ABSTRACT

An analog-to-digital converter (ADC) is provided. The ADC may include an input terminal configured to receive input signals, a digital-to-analog converter (DAC), a first switch configured to control a connection between the DAC and the input terminal, a comparator, a second switch configured to control a connection between the DAC and the comparator, and a controller configured to control the first switch, the second switch, the DAC and the comparator.

24 Claims, 27 Drawing Sheets

(58) Field of Classification Search
USPC .................................................. 341/150, 155
See application file for complete search history.

(56) References Cited

U.S. PATENT DOCUMENTS

| | | | | |
|---|---|---|---|---|
| 7,468,688 | B2* | 12/2008 | Hesener | H03M 1/183 341/144 |
| 7,741,981 | B1* | 6/2010 | Wan | H03M 1/02 341/110 |
| 7,839,315 | B2* | 11/2010 | Hesener | H03M 1/183 341/144 |
| 8,081,097 | B2* | 12/2011 | Hsu | H03M 1/1042 341/120 |
| 8,390,501 | B2 | 3/2013 | Chang et al. | |
| 8,581,770 | B2 | 11/2013 | Wang et al. | |
| 9,136,857 | B2 | 9/2015 | Bogner et al. | |
| 9,923,569 | B1 | 3/2018 | Chen et al. | |
| 10,333,539 | B2* | 6/2019 | Hsu | H03M 1/0607 |
| 2007/0115159 | A1 | 5/2007 | Tachibana et al. | |
| 2007/0236380 | A1* | 10/2007 | La Rue | H03M 1/1245 341/155 |
| 2011/0074617 | A1* | 3/2011 | Portmann | H03M 1/466 341/166 |
| 2011/0234433 | A1 | 9/2011 | Aruga et al. | |
| 2012/0194372 | A1 | 8/2012 | Venkatraman et al. | |
| 2012/0274489 | A1 | 11/2012 | Chang et al. | |
| 2015/0280729 | A1* | 10/2015 | Strode | H03M 1/38 341/110 |
| 2017/0134037 | A1 | 5/2017 | Lye et al. | |

FOREIGN PATENT DOCUMENTS

| | | |
|---|---|---|
| JP | 4470830 B2 | 6/2010 |
| JP | 2013-211611 A | 10/2013 |
| JP | 2016-106521 A | 6/2016 |
| JP | 2018-7128 A | 1/2018 |
| KR | 10-0840675 B1 | 6/2008 |
| KR | 10-2013-0068175 A | 6/2013 |
| KR | 10-1501881 B1 | 3/2015 |
| KR | 10-2016-0118430 A | 10/2016 |
| KR | 10-1672875 B1 | 11/2016 |

OTHER PUBLICATIONS

Wood, Nicholas et al., "Predicting ADC: A New Approach for Low Paper ADC Design", *2014 IEEE Dallas Circuits and Systems Conference (DCAS)*, 2014 (4 pages in English).

Hu, Yao-Sheng et al., "A 12-bit 200kS/s Subranging SAR ADC with an Energy-Curve Reshape Technique", *2016 IEEE Asian Solid-State Circuits Conference (A-SSCC)*, Nov. 7-9, Toyama, Japan, 2016 (4 pages in English).

Extended European Search Report dated Aug. 28, 2019 in counterpart European Patent Application No. 19163378.3 (12 pages in English).

Yaul, Frank M., et al., "A 10 bit SAR ADC With Data-Dependent Energy Reduction Using LSB—First Successive Approximation", *IEEE Journal of Solid-State Circuits*, Dec. 2014, pp. 2825-2834, vol. 49, No. 12.

Kim, Hyeon-June, et al., "A Delta-Readout Scheme for Low-Power CMOS Image Sensors With Multi-Column-Parallel SAR ADCs", *IEEE Journal of Solid-State Circuits*, Oct. 2016, pp. 2262-2273, vol. 51, No. 10.

Rahiminejad, Ehsan, et al., "A Power-Efficient Signal-Specific ADC for Sensor-Interface Applications", Sep. 2017, pp. 1032-1036, vol. 64, No. 9.

Liu, Maoqiang, et al., "A 7.1-fJ/Conversion-Step 88-dB SFDR SAR ADC With Energy-Free Swap to Reset", Nov. 2017, pp. 2979-2990, vol. 52, No. 11.

* cited by examiner

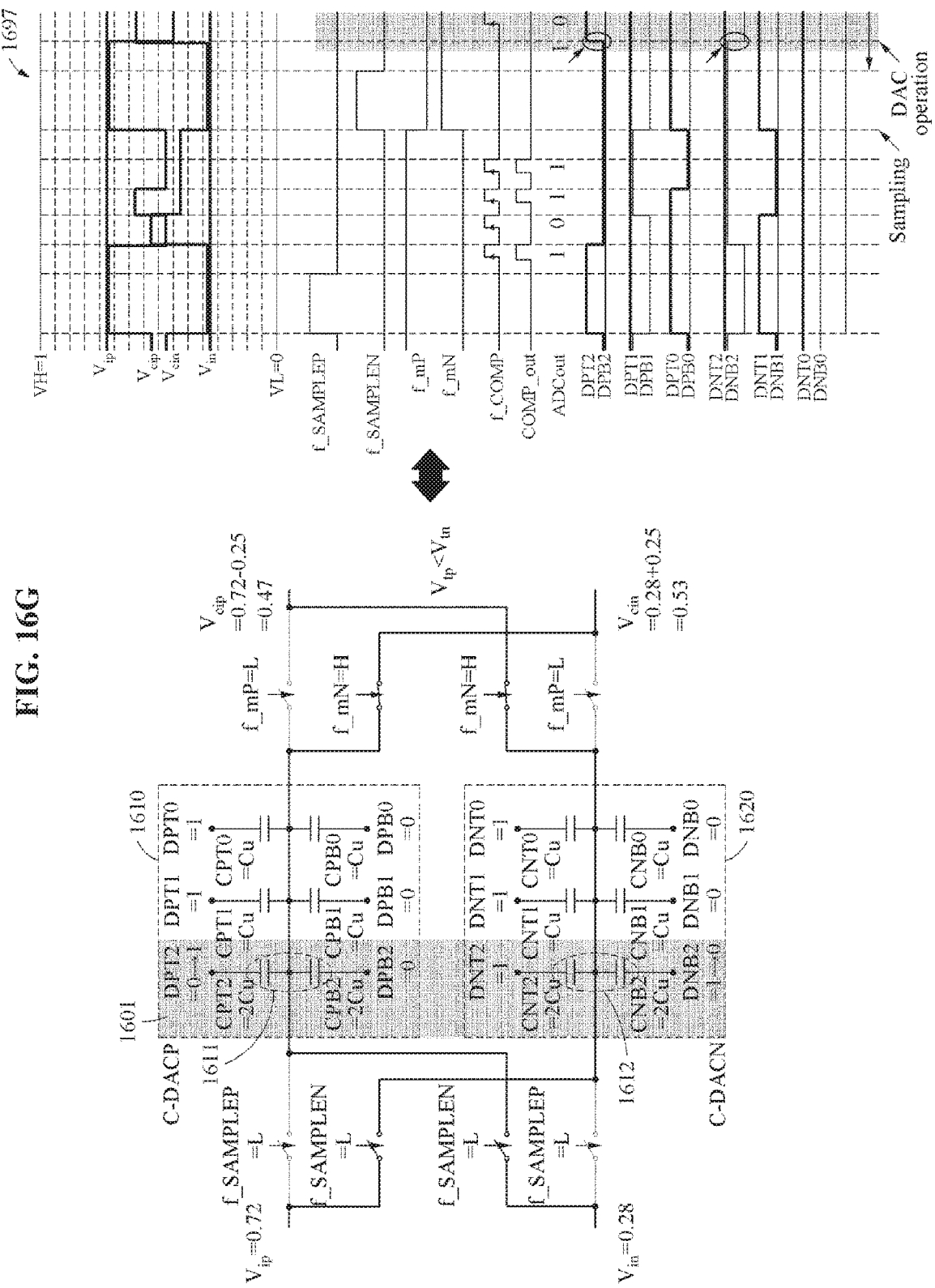

ANALOG-TO-DIGITAL CONVERTER (ADC) WITH RESET SKIPPING OPERATION AND ANALOG-TO-DIGITAL CONVERSION METHOD

CROSS-REFERENCE TO RELATED APPLICATIONS

This application claims the benefit under 35 USC § 119(a) of Korean Patent Application No. 10-2018-0034596, filed on Mar. 26, 2018, and Korean Patent Application No. 10-2018-0168593, filed on Dec. 24, 2018, in the Korean Intellectual Property Office, the entire disclosures of which are incorporated herein by reference for all purposes.

BACKGROUND

1. Field

The following description relates to an analog-to-digital conversion technology.

2. Description of Related Art

Wireless power transmission technology is increasingly being utilized in various fields. For example, wireless charging is widely provided in mobile devices such as smartphones which have recently been released. Additionally, apparatuses for wirelessly transmitting power to such mobile devices are being implemented in various other apparatuses, such as vehicles and similar apparatuses. Physical quantities such as levels of voltages, currents and signals used for communication are analog values. However, digital circuits included in an electronic device operate using digital values. Thus, an analog-to-digital converter (ADC) is an important circuit for communications between users of the electronic devices and the electronic devices or communications between different electronic devices. The ADC is a component that is included in a module to perform various functions, and may be used in various fields. For example, in a wireless communication system, an ADC converts a received analog signal into a digital signal. Due to rapid technological advances, faster, smaller and more efficient ADCs are needed.

In particular, a successive approximation register (SAR) ADC, which is configured to generate a digital signal from an analog signal using a successive approximation method, may be implemented in a relatively small area and may consume a relatively low amount of power so as to be suitable for portable electronic devices such as portable multimedia players (PMPs), mobile phones, and notebooks.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an analog-to-digital converter (ADC) includes an input terminal configured to receive input signals, a digital-to-analog converter (DAC), a first switch configured to control a connection between the DAC and the input terminal, a comparator, a second switch configured to control a connection between the DAC and the comparator, and a controller configured to control the first switch, the second switch, the DAC and the comparator.

The input terminal includes a first input terminal configured to receive a first input signal, and a second input terminal configured to receive a second input signal, the DAC includes a first capacitor group including a first set of capacitors connected to a first common node and a first control input terminal configured to receive digital control signals, and a second capacitor group including a second set of capacitors connected to a second common node and a second control input terminal configured to receive the digital control signals, and the comparator includes a positive input end and a negative input end.

The first switch is configured to connect the DAC to the input terminal during sampling of the input signals, and is configured to disconnect the DAC from the input terminal in response to a termination of the sampling.

The first capacitor group includes a first capacitor control switch configured to control a voltage applied to a capacitor of the first set of capacitors corresponding to each bit in response to the digital control signals, and the second capacitor group includes a second capacitor control switch configured to control a voltage applied to a capacitor of the second set of capacitors corresponding to each bit in response to the digital control signals.

The switch is configured to maintain a disconnection state between the first input terminal and the second common node, and maintain a disconnection state between the second input terminal and the first common node, during a first connection configuration state, and the second switch is configured to maintain a disconnection state between the first common node and the negative input end, and maintain a disconnection state between the second common node and the positive input end, during the first connection configuration state.

The first switch is configured to maintain a disconnection state between the first input terminal and the first common node, and maintain a disconnection state between the second input terminal and the second common node, during a second connection configuration state, and the second switch is configured to maintain a disconnection state between the first common node and the positive input end, and maintain a disconnection state between the second common node and the negative input end, during the second connection configuration state.

The ADC is configured to alternately switch the first connection configuration state and the second connection configuration state.

The DAC includes a plurality of capacitor cells corresponding to a first bit range and a second bit range, and the DAC is configured to adjust a voltage supplied to one end of a capacitor cell corresponding to a digital control signal received from the controller within the first bit range.

The first bit range may be a lower bit range comprising a least significant bit (LSB) to an m-th bit, the second bit range may be an upper bit range comprising an (m+1)-th bit to a most significant bit (MSB), and m is an integer between the LSB and the MSB.

The controller is configured to generate a digital control signal to change a voltage supplied to one end of a capacitor cell corresponding to each bit, sequentially from an MSB to the LSB within the lower bit range.

The DAC is configured to sample an input signal for a current analog-to-digital conversion cycle while maintaining a connection in a previous analog-to-digital conversion cycle of a capacitor cell corresponding to the upper bit range.

The DAC is configured to initialize a capacitor cell corresponding to the lower bit range and is further configured to sample the input signal.

The DAC is configured to connect a first power source to one end of a first capacitor of a capacitor pair in the capacitor cell corresponding to the lower bit range, and to connect a second power source to one end of a second capacitor of the capacitor pair, to initialize the capacitor cell corresponding to the lower bit range.

The DAC is configured to set a value of a control signal assigned to a capacitor cell corresponding to the upper bit range to an initially set value, in response to an initialization of a capacitor cell corresponding to the lower bit range, and the input terminal and the DAC being disconnected during a second connection configuration state of a first connection configuration state and the second connection configuration state.

The controller is configured to generate a digital output corresponding to each of one or more connection states of the plurality of capacitor cells in response to a termination of an adjustment of voltages of the plurality of capacitor cells.

The comparator is configured to generate a comparison signal based on a result of a comparison between a first conversion voltage received from the DAC and a second conversion voltage received from the DAC.

The comparator is configured to generate the comparison signal for each bit in a descending order of bits within a lower bit range during a current analog-to-digital conversion cycle, and the controller is configured to generate a digital control signal to determine whether to change a voltage supplied to a capacitor cell corresponding to each bit, based on the comparison signal.

The controller is configured to sequentially generate control signals to adjust capacitor cells of the DAC from an MSB of an upper bit range to an LSB of the lower bit range in response to a value corresponding to the input signal exceeding the lower bit range.

The controller is configured to determine that the value corresponding to the input signal exceeds the lower bit range in response to capacitor cells corresponding to the lower bit range in the DAC indicating a minimum value or a maximum value.

In a general aspect, analog-to-digital conversion method includes receiving input signals at an input terminal, controlling, by a first switch, a connection between a digital-to-analog converter (DAC) and the input terminal, controlling, by a second switch, a connection between the DAC and a comparator, and controlling, with a controller, the first switch, the second switch, the DAC and the comparator.

In another general aspect, an analog-to-digital converter (ADC) includes a digital-to-analog converter (DAC), a controller, a path switching circuit configured to alternately change nodes of the DAC connected to the controller and nodes of the DAC connected to one or more input terminals, wherein the DAC includes a first capacitor group comprising one or more capacitors connected to a first common node and a first control input terminal, and a second capacitor group including one or more capacitors connected to a second common node and a second control input terminal, wherein the DAC samples an input analog signal and determines a conversion signal based on the analog signal, and wherein the controller adjusts the conversion signal and generates a digital output corresponding to the analog input.

The DAC further includes a plurality of capacitor cells corresponding to a lower bit range and an upper bit range.

The lower bit range may be a range of a least significant bit (LSB) to an m-th bit, and the upper bit range is a range of an (m+1)-th bit to a most significant bit (MSB).

Other features and aspects will be apparent from the following detailed description, the drawings, and the claims.

BRIEF DESCRIPTION OF DRAWINGS

FIGS. 16A through 16J illustrate examples of a process of controlling capacitor cells of a DAC included in an ADC, in accordance with one or more embodiments.

Figure 1:
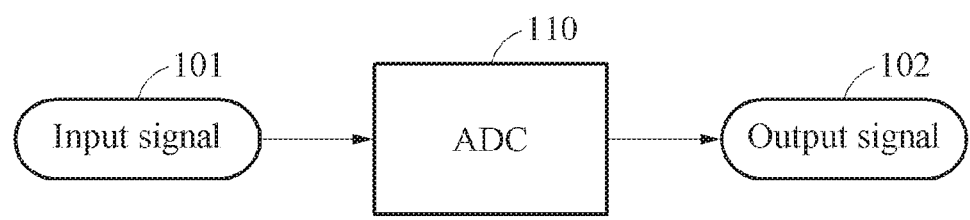
FIG. 1 illustrates an example of an analog-to-digital conversion, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various modifications may be made to the following examples. Here, the examples are not construed as limited to the disclosure and should be understood to include all changes, equivalents, and replacements within the idea and the technical scope of the disclosure.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for the purpose of describing particular examples only and is not to be limiting of the examples. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein, including technical or scientific terms, have the same meanings as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, examples will be described in detail with reference to the accompanying drawings, and like reference numerals in the drawings refer to like elements throughout.

FIG. 1 illustrates an example of an analog-to-digital conversion.

An analog-to-digital converter (ADC) 110 converts an input signal 101 of an analog type into an output signal 102 of a digital type. The ADC 110 is implemented as, for example, a successive approximation register (SAR) ADC, but is not so limited.

The SAR ADC determines a single bit for each successive approximation cycle. The SAR ADC performs a bit determination operation for each of "N" successive approximation cycles, to acquire an N-bit digital signal indicating an analog signal. "N" is an integer equal to or greater than "1." For example, an amplitude range (for example, a minimum value and a maximum value of a signal amplitude) of the input signal 101 is equally divided into $2^N$ values, and an N-bit digital code is mapped to each of the $2^N$ values. The SAR ADC generates the output signal 102 indicating a most similar value to an actual amplitude of the input signal 101 among the $2^N$ values. A conversion of an analog signal using the SAR ADC may need a conversion time that is linearly proportional to a resolution of a digital signal.

The use of the term "may" herein with respect to an example or embodiment, e.g., as to what an example or embodiment may include or implement, means that at least one example or embodiment exists where such a feature is included or implemented while all examples and embodiments are not limited thereto.

Hereinafter, a step-by-step operation of an example of an analog-to-digital conversion is described.

Figure 2:
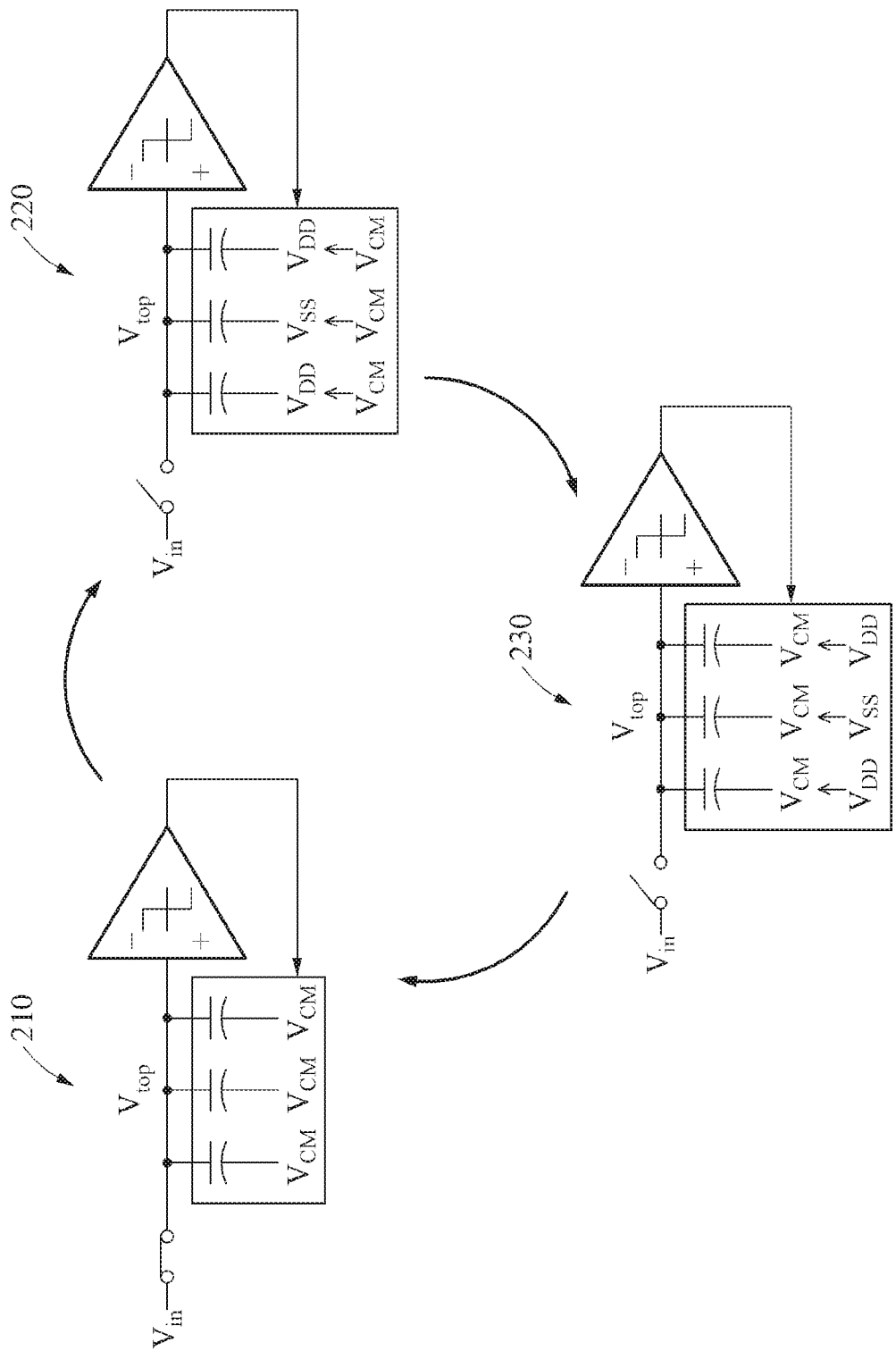
FIGS. 2 and 3 illustrate examples of an analog-to-digital conversion, in accordance with one or more embodiments.
Figure 3:
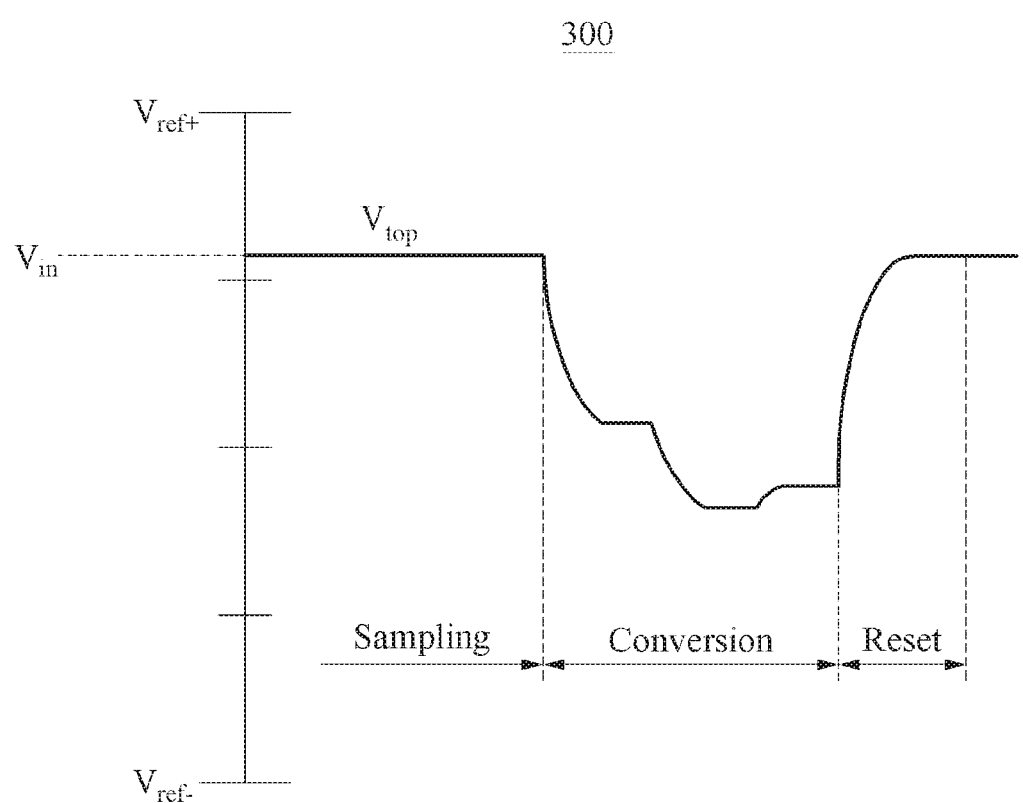

FIGS. 2 and 3 illustrate examples of an analog-to-digital conversion.

For example, when an input signal slightly changes, an ADC controls a connection of a capacitor corresponding to a low bit while maintaining a connection of a capacitor corresponding to an upper bit, to save power. For example, an amplitude of a biosignal (for example, an electrocardiogram (ECG) signal) may change slightly over time, and an amplitude of a differential signal of the biosignal may also change slightly over time. Thus, the ADC represents an input signal that changes slightly as an appropriate digital signal by controlling a capacitor corresponding to a portion of a bit range. An input signal that changes slightly over time may be, for example, a signal indicating that a difference between a value of a signal sampled in a previous analog-to-digital conversion cycle and a value of a signal sampled in a current analog-to-digital conversion cycle tends to be less than a predetermined threshold.

The ADC may operate at a low power by generating a final digital output corresponding to an analog input that is acquired in an arbitrary analog-to-digital conversion cycle by changing a portion of valid bits of an input signal that slightly changes over time, instead of changing all valid bits, as described above. For example, the ADC memorizes a portion of upper bits in a digital output determined with respect to a previous analog-to-digital conversion cycle from a sample value memorized in a previous analog-to-digital conversion cycle. The ADC searches for a value corresponding to an analog input sampled in a current analog-to-digital conversion cycle by increasing or reducing the remaining lower bits for each individual bit.

As described above, operations of the ADC to convert an input voltage $V_{in}$ of an analog input into an N-bit digital code are classified below.

Referring to FIG. 2, the ADC performs a sampling operation 210. The sampling operation 210 is an operation of sampling an input signal using a capacitor. The input signal has an input voltage $V_{in}$. In the sampling operation 210, a common mode voltage $V_{CM}$ is applied to one end of a capacitor. Also, as shown in a graph 300 of FIG. 3, a conversion voltage $V_{top}$ is sampled and held as the input voltage $V_{in}$ during the sampling operation 210.

Additionally, the ADC performs a conversion operation 220. The conversion operation 220 is an operation of adjusting a voltage applied to a capacitor through switching in a state in which the sampled input signal is held. For example, as shown in FIG. 2, a drain voltage $V_{DD}$ is applied to a first portion of capacitors, and a source voltage $V_{SS}$ is applied to another portion of the capacitors. The ADC generates a digital output based on a conversion voltage $V_{top}$ determined based on voltages applied to the capacitors. The ADC sequentially controls connections corresponding to bits of capacitors, to adjust the conversion voltage $V_{top}$ by stages as shown in the graph 300 of FIG. 3.

The ADC performs a reset operation 230. The reset operation 230 is an operation of resetting a connection of a capacitor to generate a digital output for a next analog-to-digital conversion cycle. For example, the ADC resets a voltage applied to each of the capacitors to the common mode voltage $V_{CM}$. When the connection of the capacitor is reset by the ADC, the conversion voltage $V_{top}$ returns to the input voltage $V_{in}$ during the sampling operation 210 as shown in the graph 300 of FIG. 3.

The sampling operation 210, the conversion operation 220 and the reset operation 230 described above are merely an example of operations that are logically distinguished. For example, a portion or all of the operations may be merged and performed, or the operations may be performed in a state in which the operations are clearly physically separated.

For a low-power operation, the ADC is designed to skip the above-described reset operation 230. A structure associated with skipping of the reset operation 230 will be described below.

Figure 4:
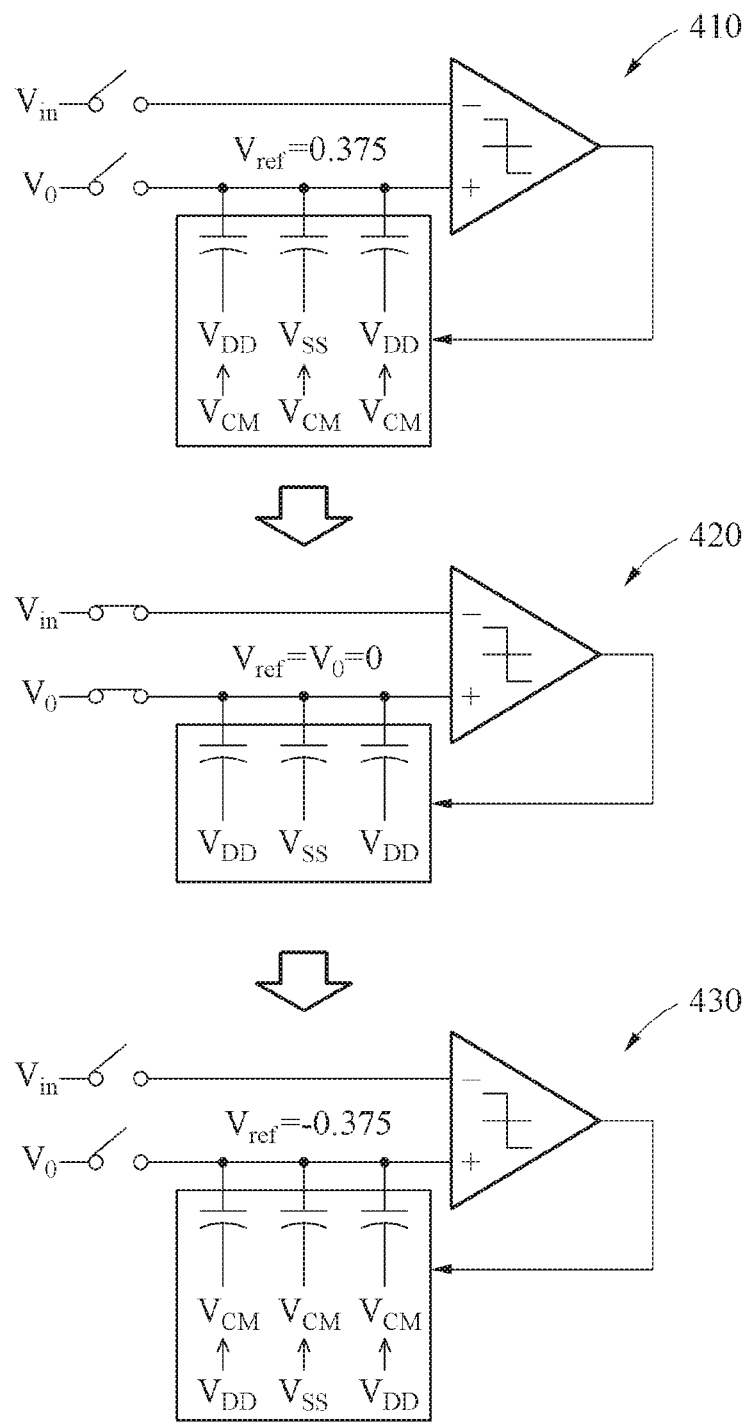
FIG. 4 illustrates an example of skipping a reset operation during an analog-to-digital conversion, in accordance with one or more embodiments.

FIG. 4 illustrates an example of skipping a reset operation during an analog-to-digital conversion.

An ADC for a slightly changing signal as described above mainly changes a voltage applied to a combination of capacitors corresponding to lower bits, and maintains a voltage applied to a combination of capacitors corresponding to upper bits. FIG. 4 illustrates an example in which the ADC uses, in a current analog-to-digital conversion cycle, a voltage applied to a combination of capacitors corresponding to upper bits in a previous analog-to-digital conversion cycle, by skipping a reset operation.

The ADC performs a conversion operation similarly to FIGS. 2 and 3. For example, in a first conversion operation 410 of FIG. 4, the ADC adjusts a voltage applied to one end of each of capacitors from a common mode voltage $V_{CM}$ to a drain voltage $V_{DD}$ or a source voltage $V_{SS}$. In FIG. 4, a reference voltage $V_{ref}$ indicated by capacitors corresponding to an adjusted connection may be, for example, 0.375 V.

After the first conversion operation 410, the ADC performs a sampling operation 420 by skipping a reset operation. For example, the ADC connects a power source (for example, a power source with a voltage $V_0$) to another end of each of the capacitors, and samples the power source.

The ADC performs a second conversion operation 430 to adjust the reference voltage $V_{ref}$. For example, the ADC samples a power source and isolates a connection to the power source, to hold electric charges corresponding to the power source. The ADC adjusts a voltage applied to another end of each of the capacitors to the common mode voltage $V_{CM}$. A reference voltage $V_{ref}$ indicated by a capacitor may be, for example, −0.375 V.

Thus, the ADC restores a voltage corresponding to upper bits in the current analog-to-digital conversion cycle even when a connection of a capacitor corresponding to an upper bit is not reset in the previous analog-to-digital conversion cycle.

However, as described above with reference to FIG. 4, when the ADC controls only a connection of a capacitor, a sign of the reference voltage $V_{ref}$ is reversed. Hereinafter, description is given of an operation by which the ADC generates a digital output corresponding to an analog input while maintaining an appropriate sign and an amplitude of a voltage corresponding to an upper bit during successive analog-to-digital conversion cycles (for example, a first cycle and a second cycle) by switching and steering a connection of a capacitor to an input power source and a controller.

Figure 5:
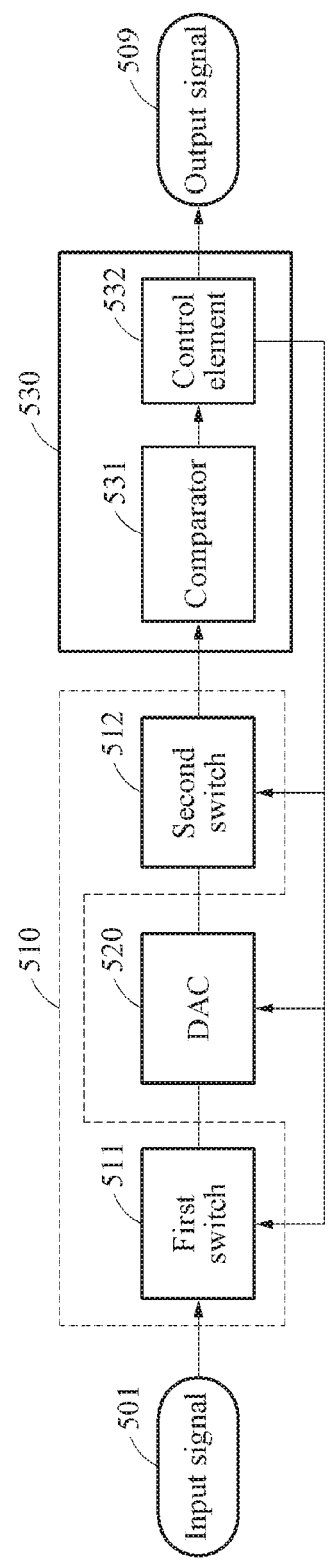
FIG. 5 is a block diagram illustrating an example of a configuration of an analog-to-digital converter (ADC), in accordance with one or more embodiments.

FIG. 5 illustrates an example of a configuration of an ADC.

Referring to FIG. 5, the ADC includes a path switching circuit 510, a digital-to-analog converter (DAC) 520, and a controller 530.

The path switching circuit 510 may alternately change nodes of the DAC 520 connected to nodes of the controller 530 and input terminals for each analog-to-digital conversion cycle. The path switching circuit 510 may include at least one switch element.

Each of the input terminals is, for example, a first input terminal configured to receive a first input signal and a second input terminal configured to receive a second input signal. A signal with an intermediate value of an amplitude of the first input signal and an amplitude of the second input signal is assumed to be a reference signal. The first input signal is a signal obtained by adding a differential value to the reference signal, and the second input signal is a signal obtained by subtracting a differential value from the reference signal.

For example, the path switching circuit 510 may include a first switch 511 and a second switch 512. The first switch 511 may control a connection between the DAC 520 and an input terminal configured to receive input signals. For example, the first switch 511 controls connections between the input terminals and front ends of the DAC 520. The second switch 512 controls a connection between the DAC 520 and a comparator 531. For example, the second switch 512 controls connections between back ends of the DAC 520 and front ends of the controller 530.

In the various examples, a front end and a back end respectively correspond to an input node and an output node of an arbitrary element. For example, a first node of a front end of the DAC 520 and a first node of a back end of the DAC may be common nodes, and a second node of a front end of the DAC 520 and a second node of a back end of the DAC may be common nodes. Each of the first switch 511 and the second switch 512 includes at least one switch element.

The first switch 511 switches a connection between a first input terminal and a first front end of the DAC 520 during a first cycle. The first switch 511 switches a connection between a second input terminal and a second front end of the DAC 520 during the first cycle. The first switch 511 switches a connection between the first input terminal and the second front end of the DAC 520 during a second cycle subsequent to the first cycle. The first switch unit 511 switches a connection between the second input terminal and the first front end of the DAC 520 during the second cycle. The first switch 511 operates so that the DAC 520 samples an input signal 501, and connects the input terminals and the front ends of the DAC 520 during a portion (for example, a sampling interval) of each of cycles. The first switch 511 connects an input terminal and the DAC 520 during sampling of input signals, and disconnects the input terminal from the DAC 520 when the sampling is terminated.

The second switch 512 connects a first back end of the DAC 520 and a first front end of the controller 530 during a first cycle. The second switch 512 connects a second back end of the DAC 520 and a second front end of the controller 530 during the first cycle. The second switch 512 connects the first back end of the DAC 520 and the second front end of the controller 530 during a second cycle subsequent to the first cycle. The second switch 512 connects the second back end of the DAC 520 and the first front end of the controller 530 during the second cycle.

Thus, the above-described first switch 511 and the above-described second switch 512 properly transfer an output of the DAC 520 to the controller 530 by alternately changing nodes connected to nodes of the DAC 520 for each analog-to-digital conversion cycle. The first cycle is a cycle in which elements are connected in a normal connection state, and the second cycle is a cycle in which elements are connected in an inverse connection state. The first cycle and the second cycle are alternately repeated.

The DAC 520 may include a first capacitor group and a second capacitor group. The first capacitor group may include capacitors connected to a first common node, and a first control input terminal configured to receive digital control signals. The second capacitor group may include capacitors connected to a second common node and a second control input terminal configured to receive digital control signals. The first control input terminal, the first common node, the second control input terminal and the second common node will be described below. The DAC 520 samples and holds an analog input signal acquired through the input terminals, based on the first capacitor group and the second capacitor group. For example, in response to the DAC 520 being connected to an input terminal, the DAC 520 samples the input signal 501 acquired through the input terminal. In response to the DAC 520 being disconnected from the input terminal by the above-described path switching unit 510 after the input signal 501 is sampled, the DAC 520 holds electric charges.

The DAC 520 determines a conversion signal based on a held analog signal and a control signal that is fed back from the controller 530. For example, the DAC 520 connects a capacitor corresponding to each bit to the ground or a power supply, to distribute the held electric charges based on capacitances of a plurality of capacitors. The control signal fed back from the controller 530 is a signal to determine whether to connect each of the capacitors to the ground or a power supply.

The DAC 520 transfers the determined conversion signal to the controller 530. In the disclosed examples, the conversion signal represents a voltage corresponding to a digital code indicated by a control signal. For example, when a control signal corresponds to a digital code having "N" bits, a voltage range of the conversion signal is divided into $2^N$ voltage values. The conversion signal has a voltage value indicated by the control signal among the $2^N$ voltage values. The conversion signal represents a voltage indicated by capacitors in which electric charges are redistributed based on a connection state changed in response to a control signal.

The controller 530 controls the first switch 511, the second switch 512, the DAC 520 and the comparator 531. For example, the controller 530 generates a control signal in response to the conversion signal, and generates a digital output corresponding to an analog input in response to an end of a current analog-to-digital conversion cycle. The controller 530 may adjust the conversion signal by sequentially controlling connections of capacitors corresponding to a predetermined bit range based on the control signal. When connections of all capacitors within a predetermined bit range are controlled, the controller 530 generates a last control signal as an output signal 509. In response to a bit beyond the bit range needing to be changed to represent the input signal 501, the controller 530 generates, as the output signal 509, a control signal generated by controlling connections of capacitors corresponding to all bits. As shown in FIG. 5, the controller 530 includes the comparator 531 and a control element 532. The comparator 531 includes a positive input end (not shown) and a negative input end (not shown), and generates a comparison signal based on a conversion voltage output from the DAC 520. In response to the comparison signal, the control element 532 generates a control signal to control the DAC 520. For example, the control element 532 generates a control signal to determine whether to change a voltage supplied to a capacitor cell corresponding to each bit based on the comparison signal. The control element may also generate control signals to control the first switch 511 and the second switch 512.

A bit range is a range indicating a portion of bits that may be represented by the DAC 520. For example, when a total number of bits of the DAC 520 is "n", a predetermined bit range includes "m" bits. In this example, "n" and "m" are integers greater than or equal to "1" and "m" is less than or equal to "n."

Additionally, the controller 530 controls the path switching circuit 510. For example, the controller 530 indicates a timing at which each of the first switch 511 and the second switch 512 changes a path.

Figure 6A:
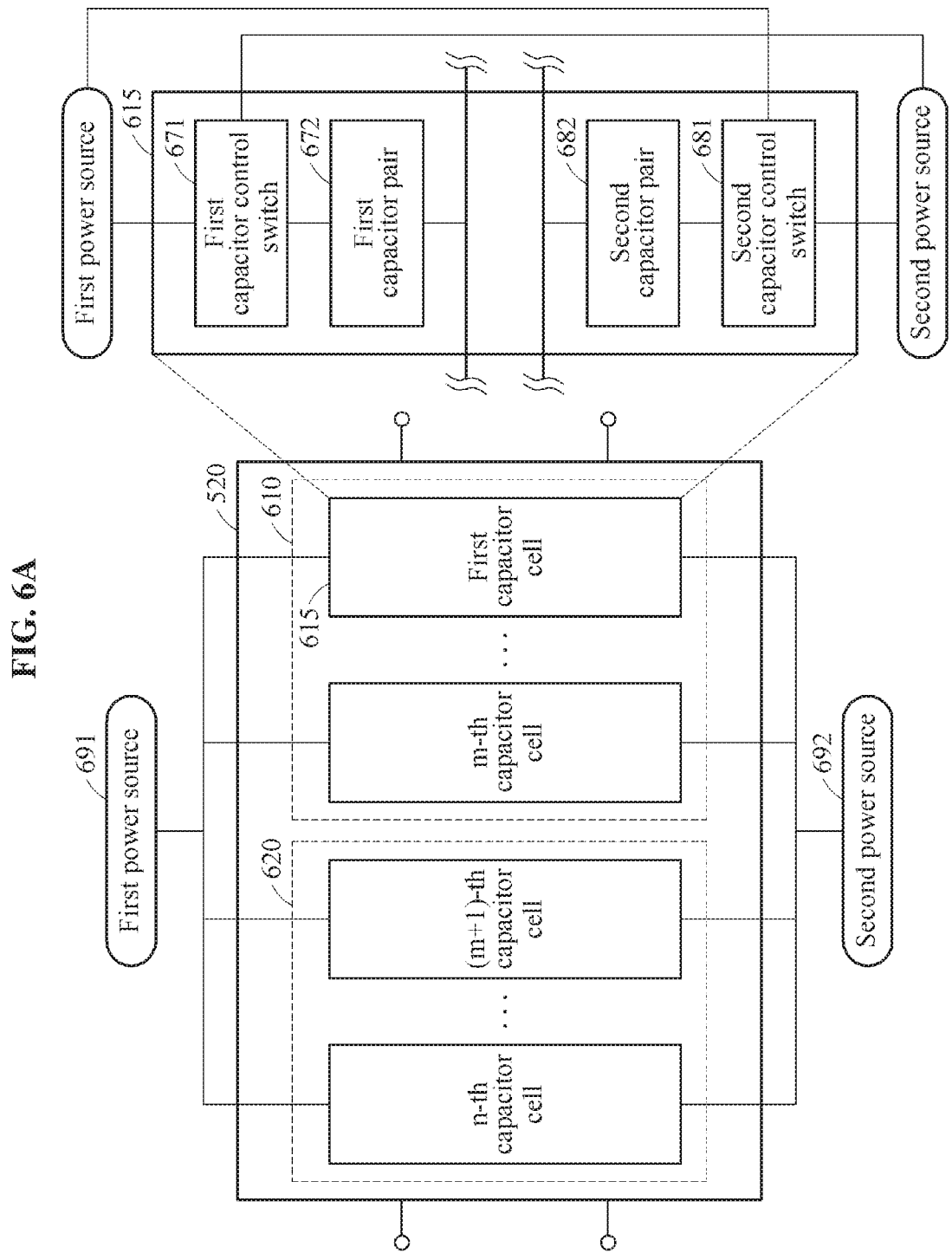
FIGS. 6A and 6B illustrate examples of a configuration of a digital-to-analog converter (DAC), in accordance with one or more embodiments.
Figure 6B:
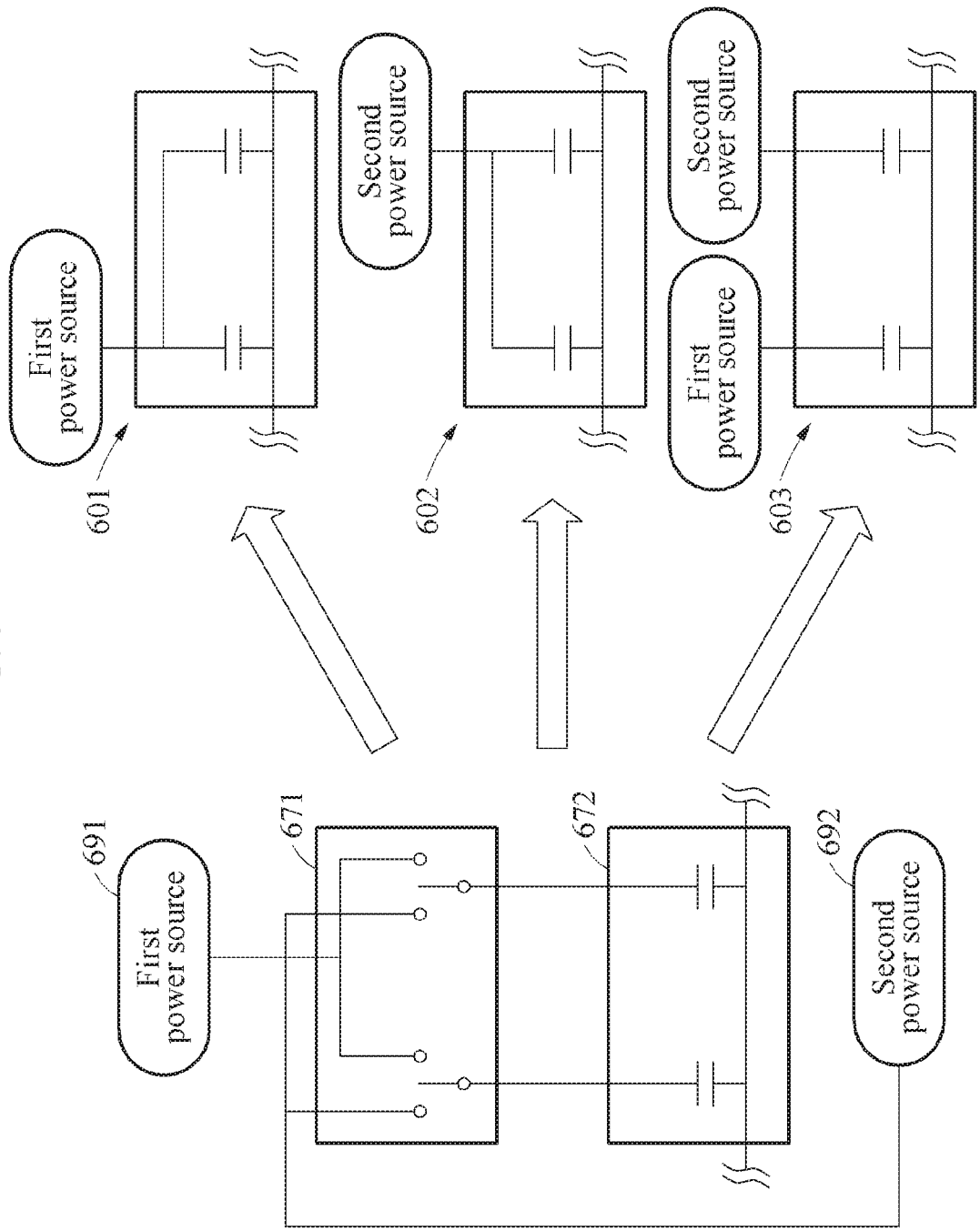

FIGS. 6A and 6B illustrate examples of a configuration of a DAC.

FIG. 6A illustrates an example of a structure of a capacitor cell of the DAC 520 of FIG. 5.

In the present examples, a first capacitor cell 615 includes capacitor pairs corresponding to an arbitrary bit. For example, a first capacitor cell 615 corresponding to an arbitrary bit includes a first capacitor pair 672 corresponding to the bit in a first capacitor group, and a second capacitor pair 682 corresponding to the bit in a second capacitor group. The first capacitor pair 672 includes two first capacitor pairs corresponding to the bit in the first capacitor group. The second capacitor pair 682 includes second capacitor pairs corresponding to the bit in the second capacitor group. The first capacitor group is a set of capacitors connected to a first common node, and the second capacitor group is a set of capacitors connected to a second common node. Capacitor cells are classified based on bits, and capacitor groups are classified based on a common node connection relationship.

Referring to FIG. 6A, the DAC 520 includes a plurality of capacitor cells corresponding to a lower bit range 610 and an upper bit range 620. For example, when "n" capacitor cells are provided, the lower bit range 610 is a range of a least significant bit (LSB) (for example, a first bit) to an m-th bit, and the upper bit range 620 is a range of an (m+1)-th bit to a most significant bit (MSB) (for example, an n-th bit). In this example, "n" and "m" are integers greater than or equal to "1" and "m" is less than or equal to "n." Each of the plurality of capacitor cells includes a capacitor with a capacitance corresponding to each bit position. For example, a capacitor cell corresponding to an LSB includes a capacitor with a basic capacitance of $C_u$, and an i-th capacitor cell corresponding to an i-th bit from a bit (for example, a second bit) subsequent to the LSB includes a capacitor with a capacitance of $2^{i-2} C_u$. Thus, a capacitor corresponding to the first bit and the second bit includes a capacitor with the basic capacitance of $C_u$. In the drawings, a capacitance of each capacitor may be expressed by omitting the basic capacitance of $C_u$.

The DAC 520 adjusts a voltage of a capacitor cell corresponding to a control signal fed back from a controller within the lower bit range 610.

Returning to FIG. 6A, each of the capacitor cells 615 includes a first capacitor control switch 671, the first capacitor pair 672, a second capacitor control switch 681 and the second capacitor pair 682. The first capacitor control switch 671 may switch a connection between the first capacitor pair 672 and a first power source 691. The second capacitor control switch 681 may switch a connection between the second capacitor pair 682 and a second power source 692. The first capacitor control switch 671 and the first capacitor pair 672 belong to an upper capacitor group and the second capacitor control switch 681 and the second capacitor pair 682 belong to a lower capacitor group as shown in FIG. 6A, however, examples are not limited thereto.

The first capacitor control switch 671 may control a voltage applied to a capacitor corresponding to each bit in response to digital control signals. For example, the first capacitor control switch 671 connects, based on a control signal received from the controller, the first capacitor pair 672 to the first power source 691 (for example, a power source to supply a drain voltage $V_{DD}$) or the second power source 692 (for example, a power source to supply a source voltage $V_{SS}$). The second capacitor control switch 681 controls a voltage applied to a capacitor corresponding to each bit in response to digital control signals. For example, the second capacitor control switch 681 connects, based on a control signal received from the controller, the second capacitor pair 682 to the first power source 691 or the second power source 692. For example, a first capacitor pair 672 and a second capacitor pair 682 of an i-th capacitor cell corresponding to an i-th bit from the LSB have capacitances of $2^{i-2} C_u$. In this example, when a control signal indicates a value of "1" for the i-th bit, a first capacitor control switch 671 and a second capacitor control switch 681 of the i-th capacitor cell connect the first capacitor pair 672 and the second capacitor pair 682 to the first power source 691 and the second power source 692, respectively. In this example, "i" is an integer that is greater than or equal to "2" and that is less than or equal to "n." Capacitors of the first capacitor cell and the second capacitor cell have capacitances of $C_u$.

FIG. 6B illustrates a portion of a capacitor cell corresponding to an arbitrary bit. For convenience of description, FIG. 6B illustrates an upper portion (for example, a portion corresponding to the first capacitor group) of the capacitor cell. Description of FIG. 6B is equally applicable to a lower portion (for example, a portion corresponding to the second capacitor group) of the capacitor cell.

Referring to FIG. 6B, the upper portion of the capacitor cell includes a first capacitor control switch 671 and a first capacitor pair 672. The first capacitor pair 672 includes, for example, a capacitor pair including two first capacitors. One end of the first capacitors is connected to a first power source 691 or a second power source 692. For example, the first capacitor control switch 671 connects the first power source 691 or the second power source 692 to each of the capacitors based on a control signal. The control signal represents a bit value that should be indicated by each capacitor cell, and connection states between capacitors and the first power source 691 and the second power source 692 are determined based on a bit value that should be indicated by a corresponding capacitor cell. Another end of the first capacitors and other ends of another capacitor cell form a common node, and the common node is connected to a front end of a comparator.

In an example, when a bit value "1" is indicated by the capacitor cell in operation 601, the first capacitor control switch 671 connects one end of the first capacitors to the first power source 691. In another example, when a bit value "0" is indicated by the capacitor cell in operation 602, the first capacitor control switch 671 connects one end of the first capacitors to the second power source 692. In another example, when the capacitor cell is initialized in operation 603, the first capacitor control switch 671 connects one end of one first capacitor of the first capacitor pair 672 to the first power source 691 and connects one end of the other first capacitor to the second power source 692.

In the present examples, an operation of initializing a capacitor cell corresponding to an arbitrary bit indicates an operation of adjusting a connection of a power source and a capacitor cell. For example, the operation of initializing the capacitor cell is an operation of connecting one end of one capacitor of a capacitor pair in the capacitor cell to the first power source 691 and connecting one end of the other capacitor to the second power source 692. A state in which a capacitor cell corresponding to an arbitrary bit is initialized is a state in which one end of one capacitor of a capacitor pair is connected to the first power source 691 and one end of the other capacitor is connected to the second power source 692.

A DAC connects one end of a capacitor included in a capacitor cell to the first power source 691 or to the second power source 692, to control the capacitor cell to indicate a bit corresponding to a control signal.

Figure 7:
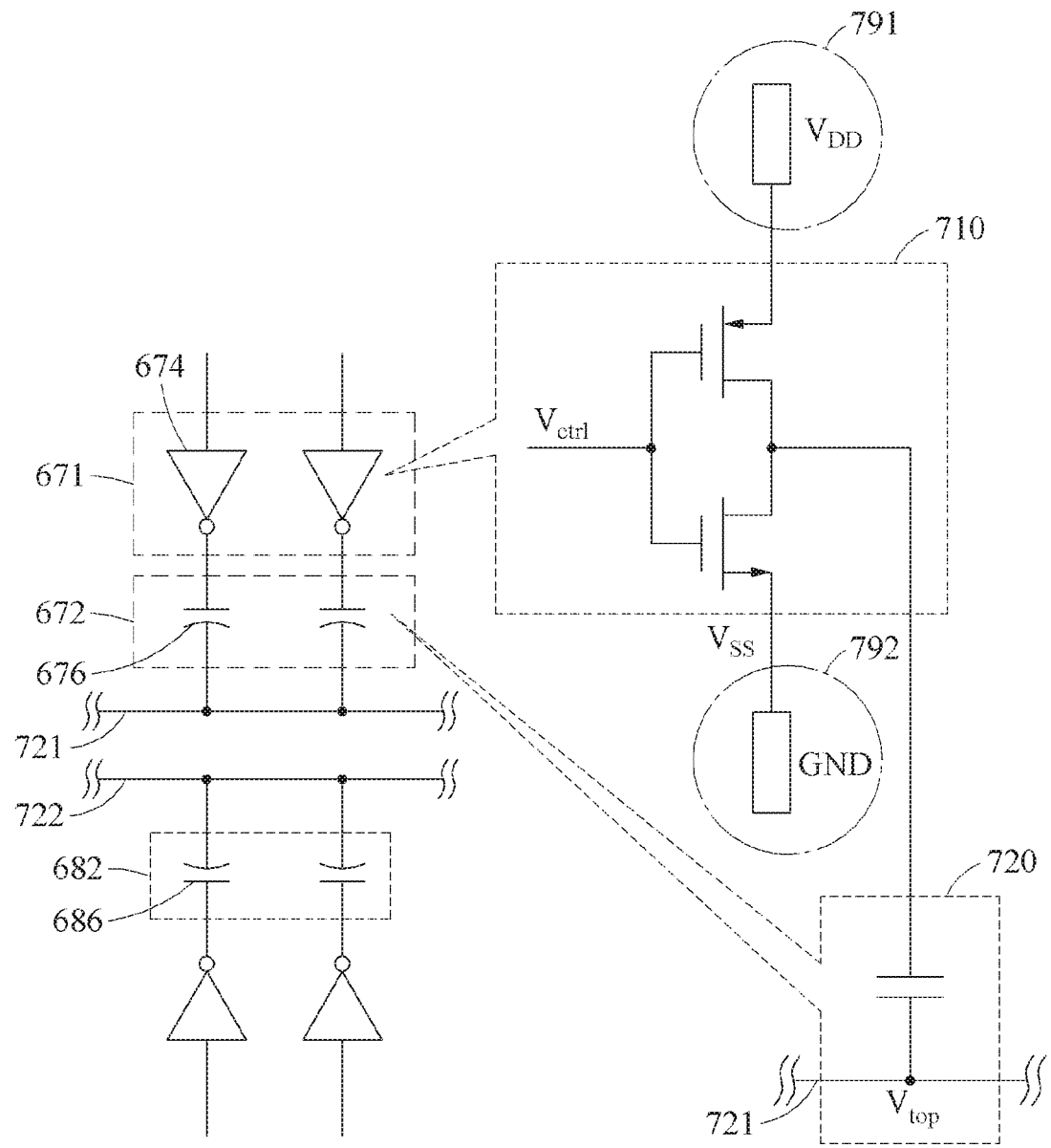
FIG. 7 illustrates an example of a configuration of a capacitor cell corresponding to one bit, in accordance with one or more embodiments.

FIG. 7 illustrates an example of a configuration of a capacitor cell.

Referring to FIG. 7, the capacitor cell includes a first capacitor control switch 671 and a first capacitor pair 672 as described above. For example, the first capacitor control switch 671 includes an inverter pair 674, and the first capacitor pair 672 includes a capacitor pair 676.

In the capacitor cell, a switch configured to control a connection between a capacitor 720 and a first power source 791 or a second power source 792 is implemented as an inverter 710. The inverter 710 connects one end of the capacitor 720 to the first power source 791 or the second power source 792 in response to a control signal (for example, a control voltage $V_{ctrl}$). Although the first power source 791 supplies a drain voltage $V_{DD}$ and the second power source 792 supplies a source voltage $V_{SS}$ as shown in FIG. 7, examples are not limited thereto. For example, another end of the capacitor 720 may be connected to a common node 721, and a voltage of the common node 721 may be denoted by $V_{top}$ as shown in FIG. 7. A first capacitor pair 672, which belongs to an upper capacitor group, includes capacitors connected to a first common node 721 and a first control input terminal configured to receive the above-described digital control signal. A second capacitor pair 682, which belongs to a lower capacitor group, includes capacitors 686 connected to a second common node 722 and a second control input terminal configured to receive the above-described digital control signal.

Figure 8:
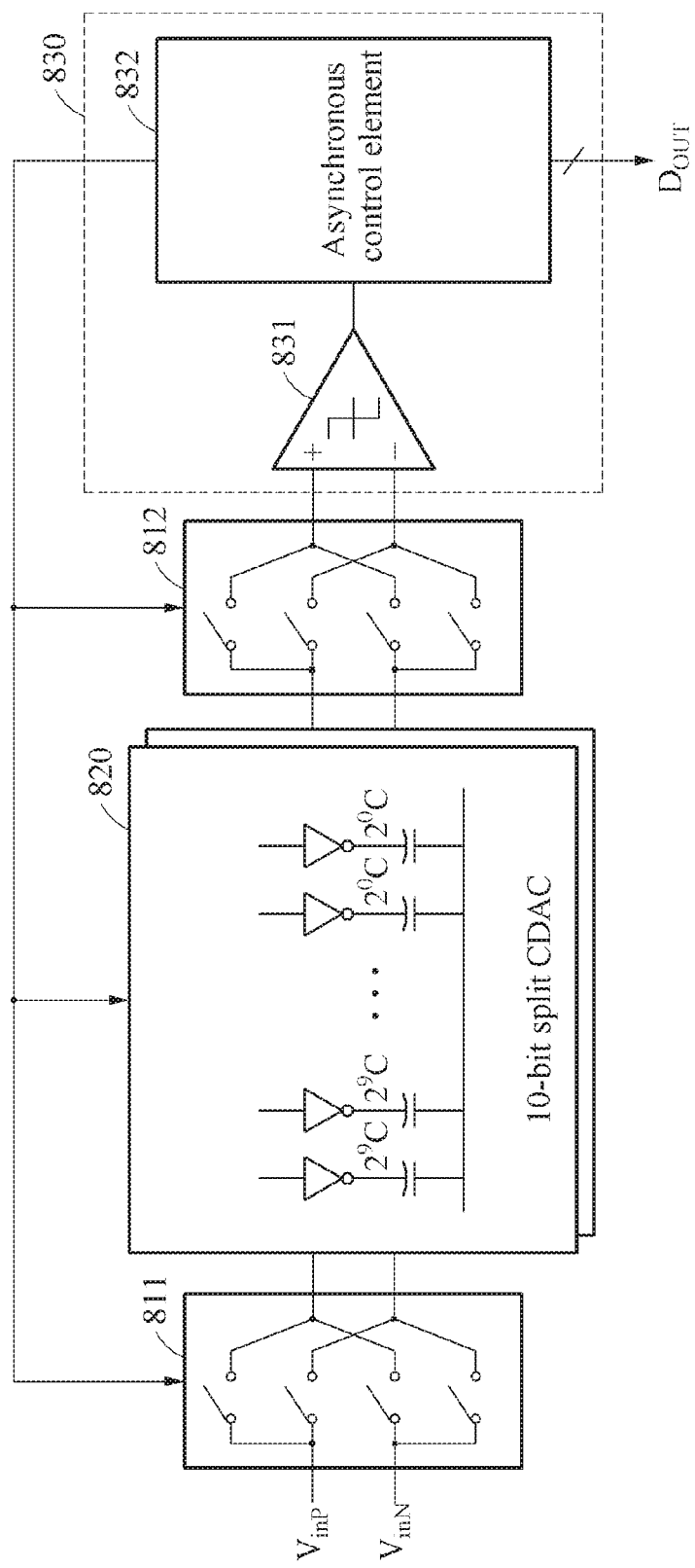
FIG. 8 illustrates another example of a configuration of an ADC, in accordance with one or more embodiments.

FIG. 8 illustrates another example of a configuration of an ADC.

A first switch 811 and a second switch 812 are implemented as multiplexers (MUXs) as shown in FIG. 8. However, examples are not limited thereto. In response to a path control signal being fed back from an asynchronous control element 832, the first switch 811 and the second switch 812 alternately change paths through which a first signal $V_{inP}$ and a second signal $V_{inN}$ are provided to a DAC 820. An example of changing the paths by the first switch 811 and the second switch 812 will be described below with reference to FIGS. 11 and 12.

In FIG. 8, the DAC 820 is implemented as a 10-bit split capacitor DAC (CDAC). The 10-bit split CDAC includes a capacitor pair corresponding to each bit as shown in FIG. 8. Each of capacitors of a capacitor pair corresponding to an i-th bit has a capacitance corresponding to $2^{i-2}$ times a basic capacitance. For example, in the 10-bit split CDAC, capacitors of a capacitor pair corresponding to a first bit and a second bit each have a capacitance corresponding to $2^0$ times the basic capacitance, and capacitors of a capacitor pair corresponding to a tenth bit each have a capacitance corresponding to $2^9$ times the basic capacitance. FIG. 8 merely illustrates upper capacitors for convenience of description, and description of lower capacitors is omitted herein.

A controller 830 may include a comparator 831 and the asynchronous control element 832 as shown in FIG. 8.

The comparator 831 generates a comparison signal based on a result of a comparison between a first conversion voltage and a second conversion voltage received from the DAC 820. The first conversion voltage and the second conversion voltage are voltages output from a first capacitor group and a second capacitor group of the DAC 820, which will be further described below with reference to FIGS. 11 and 12. The comparator 831 generates a comparison signal for each bit in a descending order of bits within a lower bit range during a current analog-to-digital conversion cycle.

The asynchronous control element 832 generates a control signal indicating a power source connected to a capacitor cell corresponding to each bit among power sources, based on the comparison signal. For example, a capacitor of a capacitor cell is connected to a first power source (for example, a power source to supply a drain voltage) or a second power source (for example, a power source to supply a source voltage).

In an example, when a voltage of a first front end of the comparator 831 is less than a voltage of a second front end of the comparator 831 for each bit in an arbitrary analog-to-digital conversion cycle, the comparator 831 outputs "1" as a comparison signal. When the comparison signal has a logical value of "1", a differential signal of an analog input is less than a reference voltage, and the asynchronous control element 832 sets a bit value of a corresponding bit to "0." The DAC 820 connects a capacitor included in a capacitor cell corresponding to the bit to the ground.

In another example, when the voltage of the first front end of the comparator 831 is greater than the voltage of the second front end in a corresponding bit, the comparator 831 outputs "0" as a comparison signal. When the comparison signal has a logical value of "0", the differential signal of the analog input is greater than the reference voltage, and the asynchronous control element 832 sets a bit value of the bit to "1." The DAC 820 connects a capacitor included in a capacitor cell corresponding to the bit to a power supply.

Electric charges are distributed to each capacitor cell of the DAC 820 based on a capacitance every time a connection of a capacitor corresponding to each bit is determined. Voltages applied to capacitor cells based on the distributed electric charges are approximated to a differential value of the analog input. The asynchronous control element 832 generates a finally determined digital output $D_{OUT}$.

However, examples are not limited to those described above, and different operations based on logical values may be set depending on the examples.

Figure 9:
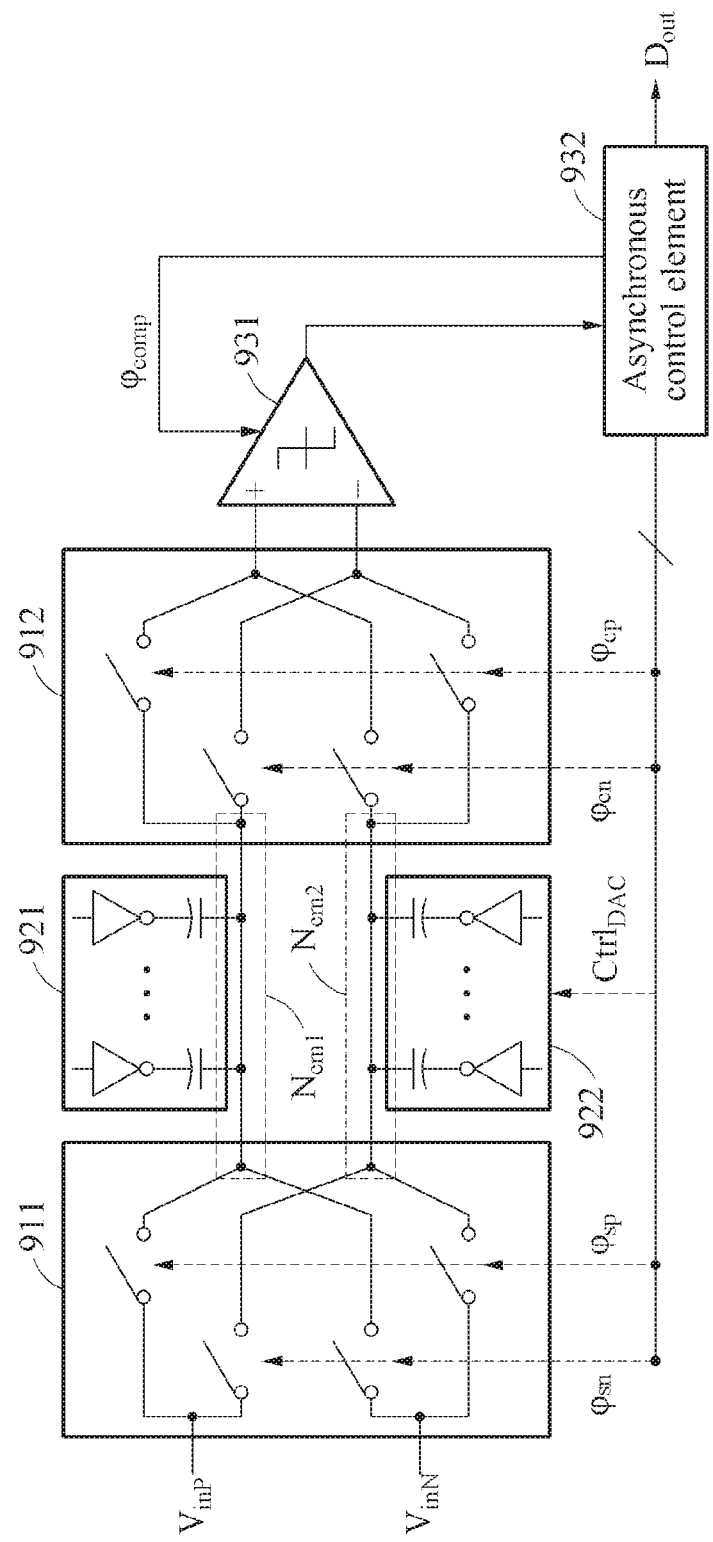
FIG. 9 illustrates an example of a selection of a path of an ADC, in accordance with one or more embodiments.
Figure 10:
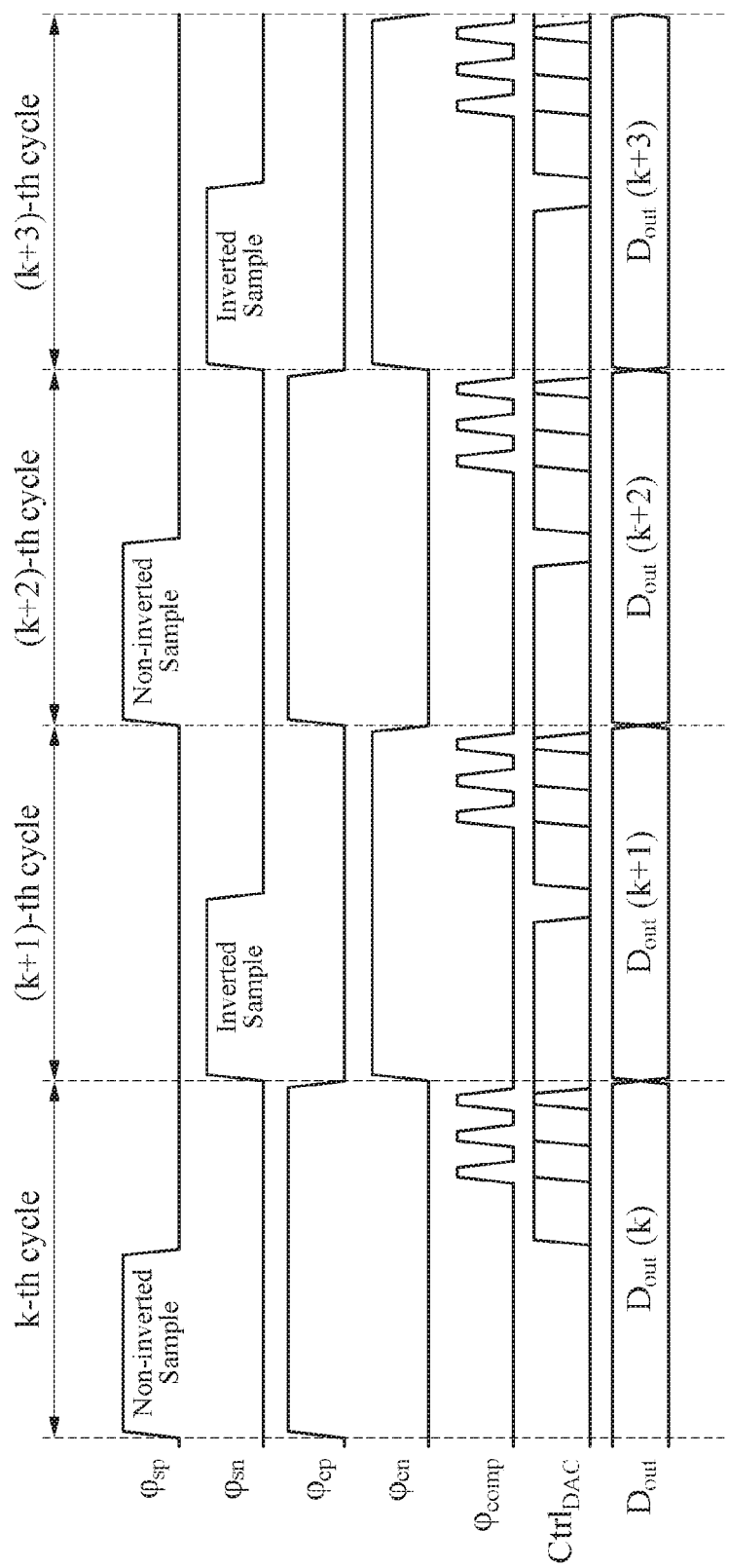
FIG. 10 illustrates a timing of an ADC, in accordance with one or more embodiments.

FIG. 9 illustrates an example of a selection of a path of an ADC, and FIG. 10 illustrates a timing of an ADC.

FIG. 10 illustrates operations of the ADC from a k-th cycle to a (k+3)-th cycle. In this example, "k" is an integer greater than or equal to "1." The k-th cycle and a (k+2)-th cycle correspond to, for example, a first cycle. A (k+1)-th cycle and the (k+3)-th cycle correspond to, for example, a second cycle.

Referring to FIG. 9, an asynchronous control element 932 controls a first switch 911 based on a first forward switch signal $\varphi_{sp}$ and a first reverse switch signal $\varphi_{sn}$. Additionally, the asynchronous control element 932 controls a second switch 912 based on a second forward switch signal $\varphi_{cp}$ and a second reverse switch signal $\varphi_{cn}$. The asynchronous control element 932 controls a comparator 931 based on a control signal $\varphi_{comp}$ of the comparator 931. Also, the asynchronous control element 932 changes a connection of each capacitor based on a control signal $Ctrl_{DAC}$. The asynchronous control element 932 generates a finally determined digital output $D_{out}$.

In the k-th cycle, the asynchronous control element 932 samples a first differential signal $V_{inP}$ to a first capacitor group 921 by applying the first forward switch signal $\varphi_{sp}$ during a sampling interval. In response to the sampling interval elapsing, the asynchronous control element 932 holds the first differential signal $V_{inP}$ by switching off the first forward switch signal $\varphi_{sp}$. Simultaneously, the asynchronous control element 932 samples a second differential signal $V_{inN}$ to a second capacitor group 922 by applying the first forward switch signal $\Phi_{sp}$ during the sampling interval. In response to the sampling interval elapsing, the asynchronous control element 932 holds the second differential signal $V_{inN}$ by switching off the first forward switch signal $\varphi_{sp}$.

As described above with reference to FIG. 6A, the first capacitor group 921 includes capacitors connected to a first common node $N_{cm1}$ within a DAC, and the second capacitor group 922 includes capacitors connected to a second common node $N_{cm2}$. In the present examples, a first capacitor group is mainly illustrated in a top portion and a second capacitor group is mainly illustrated in a bottom portion. The first capacitor group 921 is referred to as an upper capacitor group 921, and the second capacitor group 922 is referred to as a lower capacitor group 922.

After the sampling interval in the k-th cycle, the asynchronous control element 932 adjusts a connection of a second bit group (for example, an upper bit group) of the upper capacitor group 921 and an upper bit group of the lower capacitor group 922, based on the control signal $Ctrl_{DAC}$. The upper bit group of the upper capacitor group 921 is a group including capacitors corresponding to an upper bit range in the upper capacitor group 921. The upper bit group of the lower capacitor group 922 is a group including capacitors corresponding to an upper bit range in the lower capacitor group 922.

When the upper bit groups are adjusted, the asynchronous control element 932 adjusts connections of capacitors corresponding to lower bit groups. A lower bit group of the upper capacitor group 921 is a group including capacitors corresponding to a lower bit range in the upper capacitor group 921. A lower bit group of the lower capacitor group 922 is a group including capacitors corresponding to a lower bit range in the lower capacitor group 922. The asynchronous control element 932 connects the upper capacitor group 921 to a first front end of the capacitor 931 and connects the lower capacitor group 922 to a second front end of the capacitor 931, based on the second forward switch signal $\varphi_{cp}$. The asynchronous control element 932 generates control signals $\varphi_{comp}$ of the comparator 931 for each of bits of a first bit group and provides the control signals $\varphi_{comp}$ to the comparator 931. Based on conversion voltages determined based on an adjustment of the first bit group, the asynchronous control element 932 generates the digital output $D_{out}$.

In the (k+1)-th cycle, the asynchronous control element 932 samples the first differential signal $V_{inP}$ to the lower capacitor group 922 by applying the first reverse switch signal $\varphi_{sn}$ during a sampling interval. In response to the sampling interval elapsing, the asynchronous control element 932 holds the first differential signal $V_{inP}$ by switching off the first reverse switch signal $\varphi_{sn}$. Simultaneously, the asynchronous control element 932 samples the second differential signal $V_{inN}$ to the upper capacitor group 921 by applying the first reverse switch signal $\varphi_{sn}$ during the sampling interval. In response to the sampling interval elapsing, the asynchronous control element 932 holds the second differential signal $V_{inN}$ by switching off the first reverse switch signal $\varphi_{sn}$.

An operation performed after the sampling interval in the (k+1)-th cycle may be similar to that of the k-th cycle. Unlike the k-th cycle, in the (k+1)-th cycle, the asynchronous control element 932 connects the upper capacitor group 921 to the second front end of the comparator 931 and connects the lower capacitor group 922 to the first front end of the comparator 931, based on the second reverse switch signal $\varphi_{cn}$.

Operations in the (k+2)-th cycle are identical to the operations in the k-th cycle, and operations in the (k+3)-th cycle are identical to the operations in the (k+1)-th cycle, and accordingly a description thereof is not repeated herein.

Figure 11:
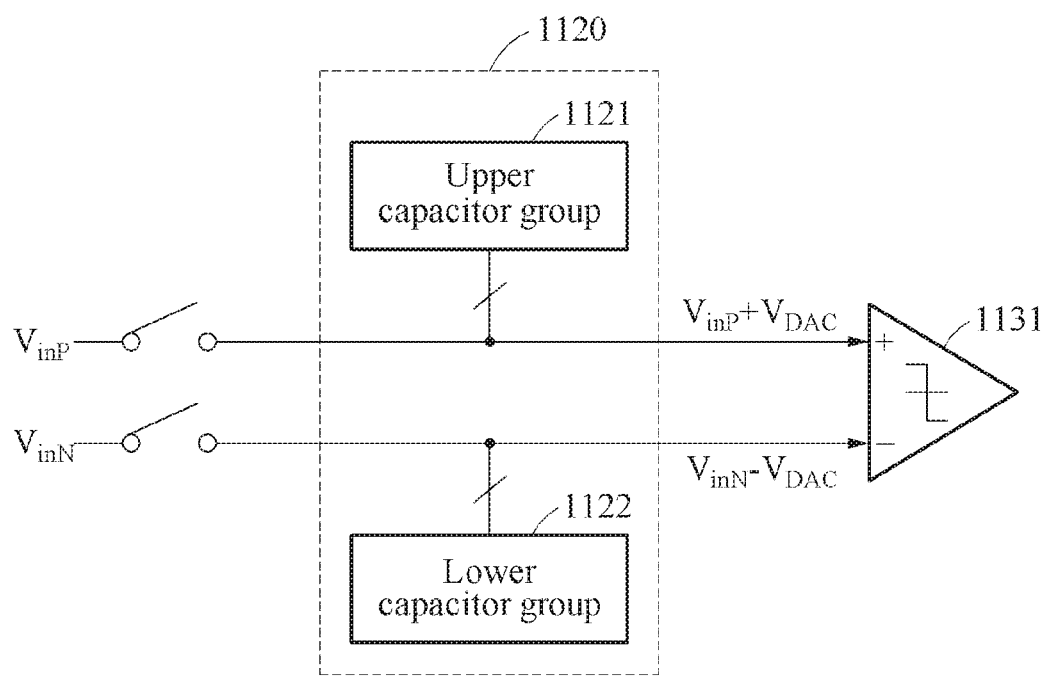
FIGS. 11 and 12 briefly illustrate examples of paths of an ADC of FIG. 9, in accordance with one or more embodiments.
Figure 12:
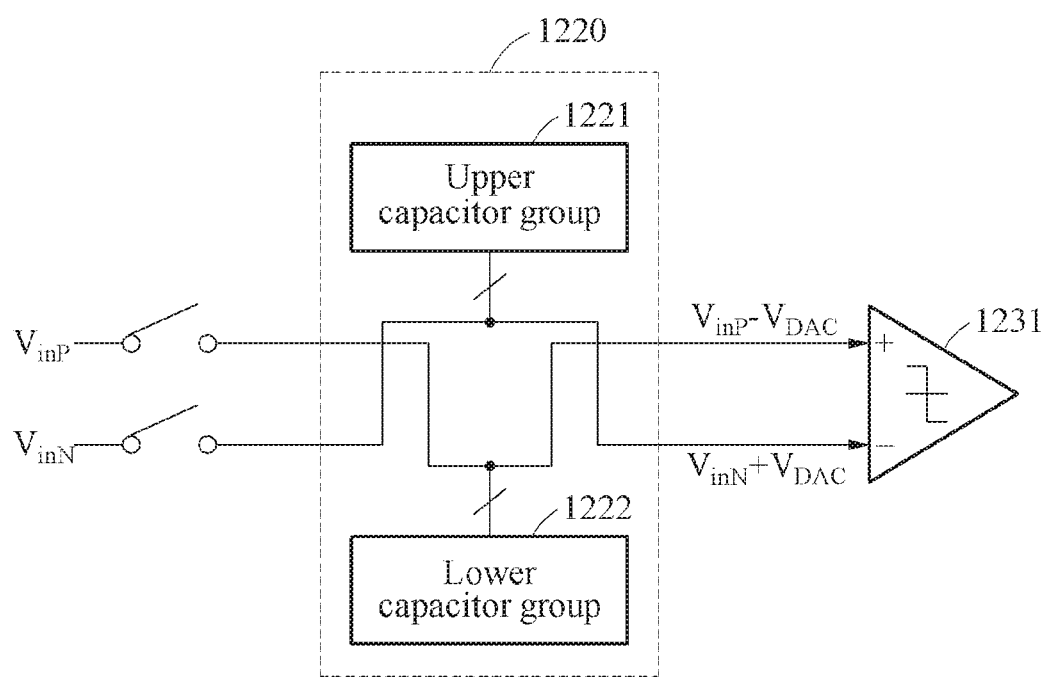

FIGS. 11 and 12 briefly illustrate examples of paths of the ADC of FIG. 9.

Referring to FIG. 11, during a first cycle, a path switching circuit (as illustrated in FIG. 5) connects a first input terminal $V_{inP}$ and a first front end of a controller to an upper capacitor group 1121 of a DAC 1120, and connects a second input terminal $V_{inN}$ and a second front end of the controller to a lower capacitor group 1122 of the DAC 1120.

In a forward connection (for example, a first connection configuration state) of FIG. 11, the upper capacitor group 1121 may be connected to a first front end (for example, a positive end) of a comparator 1131. The upper capacitor group 1121 is a group including a first capacitor control switch and a first capacitor pair. The lower capacitor group 1122 may be connected to a second front end (for example, a negative end) of the comparator 1131. The lower capacitor group 1122 is a group including a second capacitor control switch and a second capacitor pair. For example, when a capacitor connection adjustment for a second bit group is completed, a voltage of "$V_{inP}+V_{DAC}$" is input to the first front end (for example, a positive end) of the comparator 1131, and a voltage of "$V_{inN}-V_{DAC}$" is input to the second front end (for example, a negative end) of the comparator 1131. In this example, $V_{DAC}$ includes a voltage applied to the upper capacitor group 1121 by electric charges redistributed to capacitors within the upper capacitor group 1121 and a voltage applied to the lower capacitor group 1122 by electric charges redistributed to capacitors within the lower capacitor group 1122.

During a second cycle subsequent to the first cycle, the path switching circuit (as illustrated in FIG. 5) connects the first input terminal and the first front end of the controller to the lower capacitor group 1122, and connects the second input terminal and the second front end of the controller to the upper capacitor group 1121. For example, in the first connection configuration state, a first switch maintains a disconnection between a first input terminal and a second common node, and a disconnection between a second input terminal and a first common node. In the first connection configuration state, a second switch maintains a disconnection between the first common node and a negative input end, and a disconnection between the second common node and a positive input end.

In a reverse connection (for example, a second connection configuration state) of FIG. 12, an upper capacitor group 1221 of a DAC 1220 is connected to a second front end (for example, a negative end) of a comparator 1231. A lower capacitor group 1222 of the DAC 1220 is connected to a first front end (for example, a positive end) of the comparator 1231. For example, when a capacitor connection adjustment for a second bit group is completed, a voltage of "$V_{inP}-V_{DAC}$" is input to the first front end (for example, a positive end) of the comparator 1231, and a voltage of "$V_{inN}+V_{DAC}$" is input to the second front end (for example, a negative end) of the comparator 1231.

For example, in the second connection configuration state, the first switch maintains a disconnection between the first input terminal and the first common node, and a disconnection between the second input terminal and the second common node. In the second connection configuration state, the second switch maintains a disconnection between the first common node and the positive input end, and a disconnection between the second common node and the negative input end.

The ADC alternately switches the first connection configuration state and the second connection configuration state.

Figure 13:
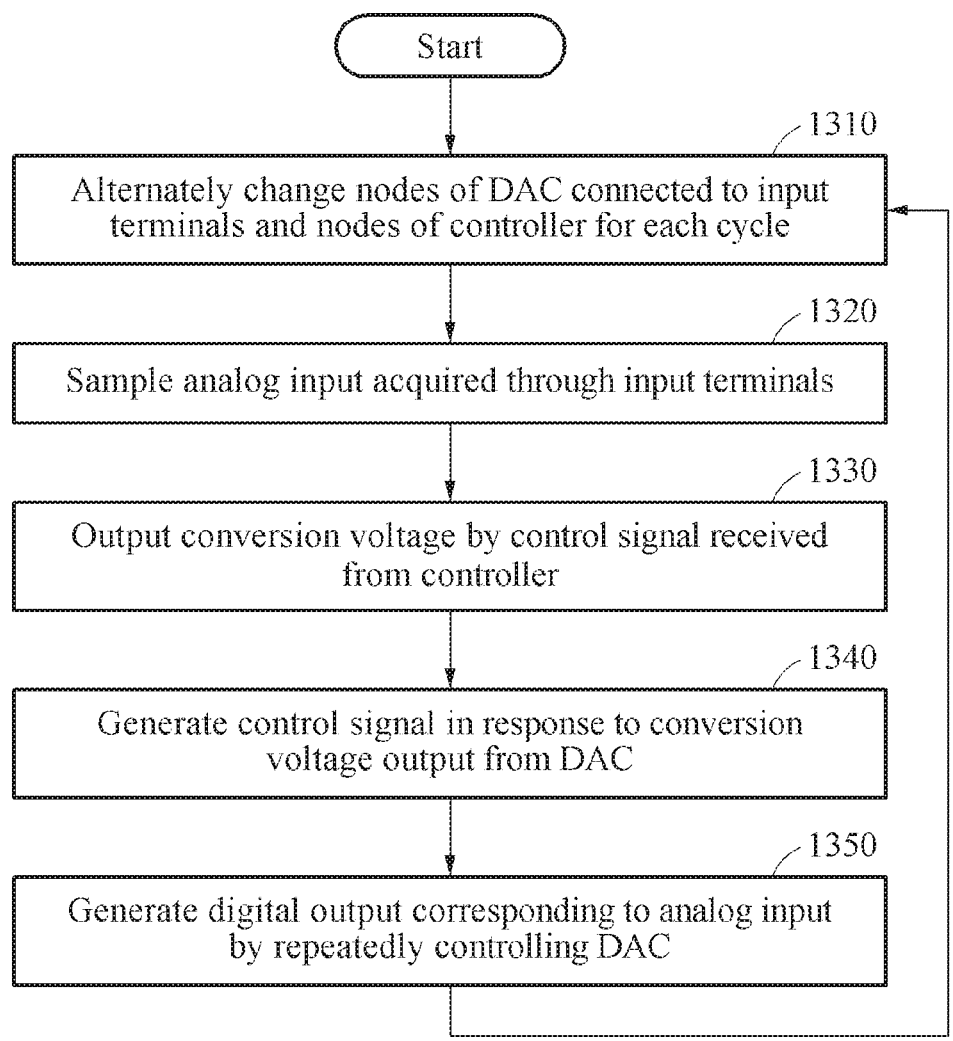
FIG. 13 is a flowchart illustrating an example of an analog-to-digital conversion method, in accordance with one or more embodiments.

FIG. 13 is a flowchart illustrating an example of an analog-to-digital conversion method. The operations in FIG. 13 may be performed in the sequence and manner as shown, although the order of some operations may be changed or some of the operations omitted without departing from the spirit and scope of the illustrative examples described. Many of the operations shown in FIG. 13 may be performed in parallel or concurrently. One or more blocks of FIG. 13, and combinations of the blocks, can be implemented by special purpose hardware-based computer that perform the specified functions, or combinations of special purpose hardware and computer instructions. In addition to the description of FIG. 4 below, the descriptions of FIGS. 1-12 are also applicable to FIG. 13, and are incorporated herein by reference. Thus, the above description may not be repeated here.

Referring to FIG. 13, in operation 1310, an ADC alternately changes nodes of a DAC connected to input terminals and nodes of a controller for each analog-to-digital conversion cycle.

In operation 1320, the ADC samples an analog input (for example, an input signal) acquired through the input terminals. For example, the DAC samples an analog input for a current analog-to-digital conversion cycle while maintaining a connection of a capacitor cell corresponding to an upper bit range in a previous analog-to-digital conversion cycle.

When a capacitor cell corresponding to a lower bit range is initialized, the DAC samples the sampled analog input. When the capacitor cell corresponding to the lower bit range is being connected to a power source, the DAC connects the capacitor cell corresponding to the lower bit range to one of the input terminals to initialize the capacitor cell corresponding to the lower bit range.

In operation 1330, the ADC outputs a conversion voltage based on a control signal received from a controller. For example, the conversion voltage is a voltage of a common node determined based on a connection between each capacitor and each power source. The conversion voltage may include a first conversion voltage and a second conversion voltage, and the common node may include a first common node and a second common node. The first common node is a node to which other ends of capacitors of a first capacitor group are connected in common, and the first conversion voltage is output by the first capacitor group. The second common node is a node to which other ends of capacitors of a second capacitor group are connected in common, and the second conversion voltage is output by the second capacitor group.

The DAC adjusts a voltage of a capacitor cell corresponding to a bit designated in a previous analog-to-digital conversion cycle within the upper bit range. The DAC sequentially changes connections of capacitor cells for each bit in the lower bit range.

In operation 1340, the ADC generates a control signal in response to the conversion voltage output from the DAC. For example, the controller generates a control signal in response to the conversion voltage output from the DAC. A comparator of the controller generates a comparison signal based on a differential value between the first conversion voltage indicated by the first capacitor group and the second conversion voltage indicated by the second capacitor group for each bit. An asynchronous control element of the controller generates a control signal to set a logical value of a corresponding bit to "0" or "1" in response to the comparison signal.

In operation 1350, the ADC generates a digital output corresponding to the analog input by repeatedly controlling the DAC. For example, in response to a voltage adjustment of a plurality of capacitor cells being completed, the controller generates a digital output corresponding to each of connection states of the plurality of capacitor cells. An example of repeatedly controlling the DAC will be further described below with reference to FIG. 14.

In the present examples, the upper bit range indicates a higher bit position than a bit position of the lower bit range. However, examples are not limited thereto.

Figure 14:
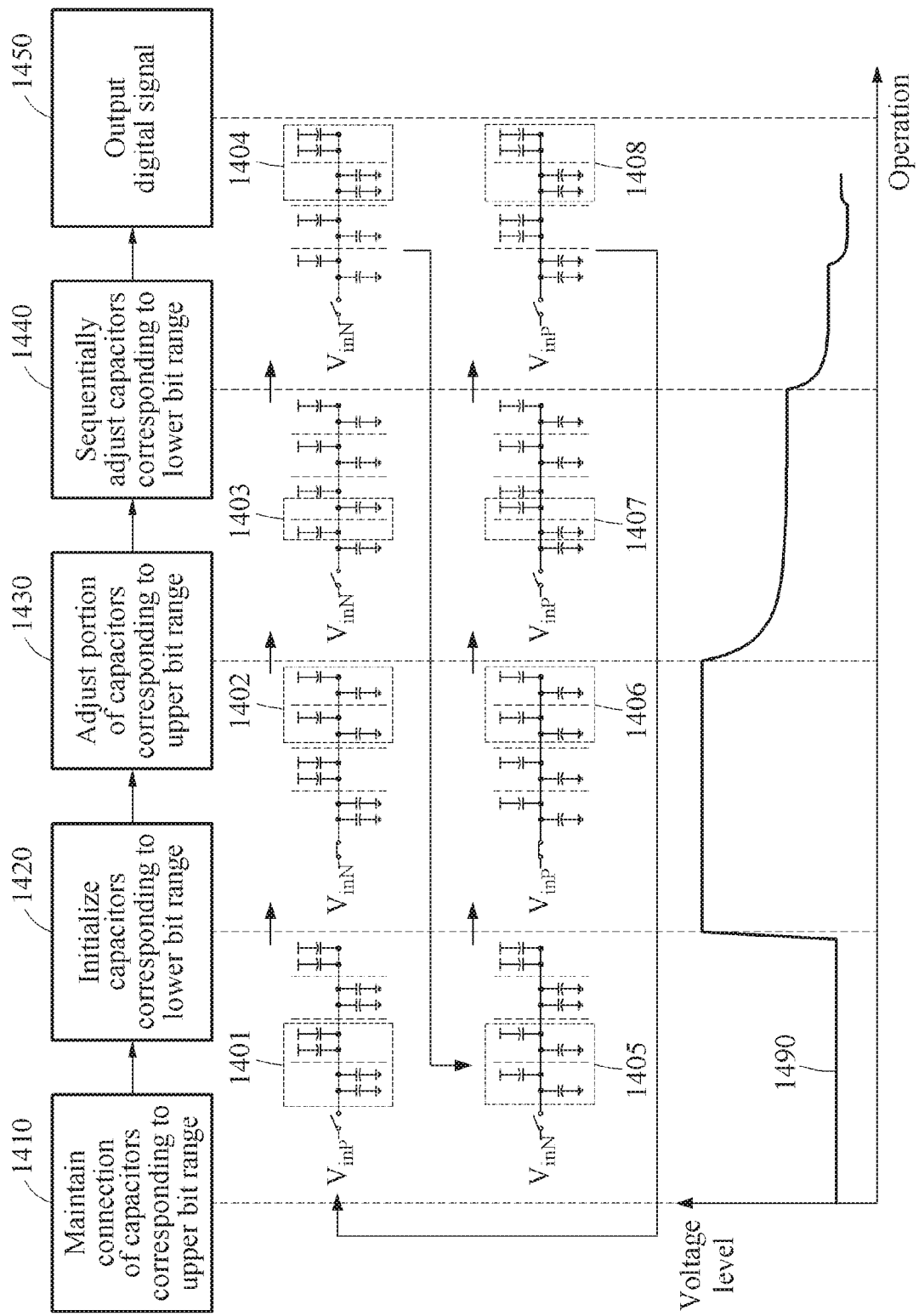
FIG. 14 illustrates an example of a control of each capacitor cell by an ADC, in accordance with one or more embodiments.

FIG. 14 illustrates an example of a control of each capacitor cell by an ADC.

FIG. 14 illustrates a process in which a connection state of a first capacitor group (for example, an upper capacitor group) is changed in a DAC. For convenience of description, a connection state of a second capacitor group (for example, a lower capacitor group) is omitted herein. In the following description, a lower bit range includes, for example, a bit range including an LSB, that is, a zeroth bit to a first bit, and an upper bit group includes, for example, a bit range of a second bit to a third bit which are from the LSB. A logical value indicated by a capacitor cell corresponding to each bit is determined based on a power source connected to one end of a capacitor pair included in the capacitor cell as described above with reference to FIG. 6B. Referring to FIG. 14, to facilitate intuitive understanding, a capacitor connected to a first power source may be located above a common node, and a capacitor connected to a second power source may be located below the common node. FIG. 14 illustrates a change in an electrical connection regardless of an arrangement structure of actual elements.

For example, in operation 1410, the ADC maintains a connection of capacitors corresponding to the upper bit range. For example, as shown in FIG. 14, the ADC maintains, during a current analog-to-digital conversion cycle, connection states of capacitors 1401 corresponding to the upper bit range in a previous analog-to-digital conversion cycle. A conversion voltage 1490 output by the first capacitor group is maintained to be the same as in the previous analog-to-digital conversion cycle. For example, one end of each of capacitors corresponding to the third bit and the fourth bit may be maintained to be in the same connection state as the connection state of the previous analog-to-digital conversion cycle.

In operation 1420, the ADC initializes capacitors 1402 corresponding to the lower bit range. For example, as shown in FIG. 14, the ADC connects the first power source to one end of one capacitor of a capacitor pair in a capacitor cell corresponding to the lower bit range and connects the second power source to one end of the other capacitor, to initialize the capacitor cell corresponding to the lower bit range. For example, a DAC connects the first power source to one end of one capacitor of each of capacitor pairs corresponding to the zeroth bit and the first bit, and connects the second power source to one end of the other capacitor. In this example, the ADC samples an input signal in a connection state in which the capacitors 1402 corresponding to the lower bit range are initialized, and in the connection state of the capacitors 1401 corresponding to the upper bit range in the previous analog-to-digital conversion cycle. The conversion voltage 1490 output by the first capacitor group is equalized to a voltage (for example, a voltage $V_{inN}$ in FIG. 14) of the input signal.

In operation 1430, the ADC adjusts a portion of the capacitors corresponding to the upper bit range by adjusting a voltage supplied to the capacitors. For example, after a sampling operation, the ADC initializes capacitors 1403 designated in the previous analog-to-digital conversion cycle. After the sampling operation, the DAC and the input terminals are electrically disconnected. Through an initialization of the capacitors 1403, the conversion voltage 1490 is adjusted to a voltage corresponding to bits designated in the previous analog-to-digital conversion cycle. In response to the DAC being disconnected from input terminals after the capacitor cell corresponding to the lower bit range is initialized, the DAC changes a voltage supplied to one end of a capacitor cell corresponding to a bit designated in the previous analog-to-digital conversion cycle within the upper bit range. For example, the DAC connects the first power source to one capacitor of a capacitor pair corresponding to the second bit and the third bit and connects the second power source to the other capacitor. For example, when a capacitor cell corresponding to the lower bit range is initialized and when the DAC and input terminals are disconnected, the DAC sets a value of a control signal assigned to a capacitor cell corresponding to the upper bit range to an initial value (for example, DPT2=DNT2=1 and DPB2=DNB2=0 in FIGS. 16A through 16J).

In operation 1440, the ADC sequentially adjusts capacitors 1404 corresponding to the lower bit range. For example, an asynchronous control element generates a control signal to change a voltage supplied to one end of a capacitor cell corresponding to each bit, sequentially from an MSB to an LSB within the lower bit range. The ADC adjusts a voltage supplied to one end of a capacitor cell corresponding to a control signal received from a controller within the lower bit range. For example, in response to the control signal, the ADC connects a power source to each capacitor pair in a descending order of bits within the lower bit range. The conversion voltage 1490 is adjusted for each bit as shown in FIG. 14.

When a capacitor adjustment for the lower bit range is completed in operation 1440, the ADC outputs a digital signal in operation 1450. In FIG. 14, a digital signal is represented as "0101."

An example of the operation of the ADC in a second cycle that is a reverse connection has been described above. The ADC operates in a first cycle that is a forward connection.

For example, during the first cycle, in operation 1410, the ADC maintains a connection of capacitors corresponding to the upper bit range. For example, the ADC maintains connection states of capacitors 1405 corresponding to the upper bit range.

In operation 1420, the ADC initializes capacitors 1406 corresponding to the lower bit range and samples an input signal. Because the ADC operates in the first cycle, the input signal corresponds to a forward voltage $V_{inP}$.

In operation 1430, the ADC adjusts connections of capacitors 1407 designated in a previous cycle within the upper bit range. As shown in FIG. 14, the conversion voltage 1490 is adjusted based on a change in connections of capacitors corresponding to the upper bit range.

In operation 1440, the ADC sequentially adjusts capacitors 1408 corresponding to the lower bit range. In operation 1450, the ADC outputs a final digital signal. The final digital signal is, for example, "0101."

Figure 15:
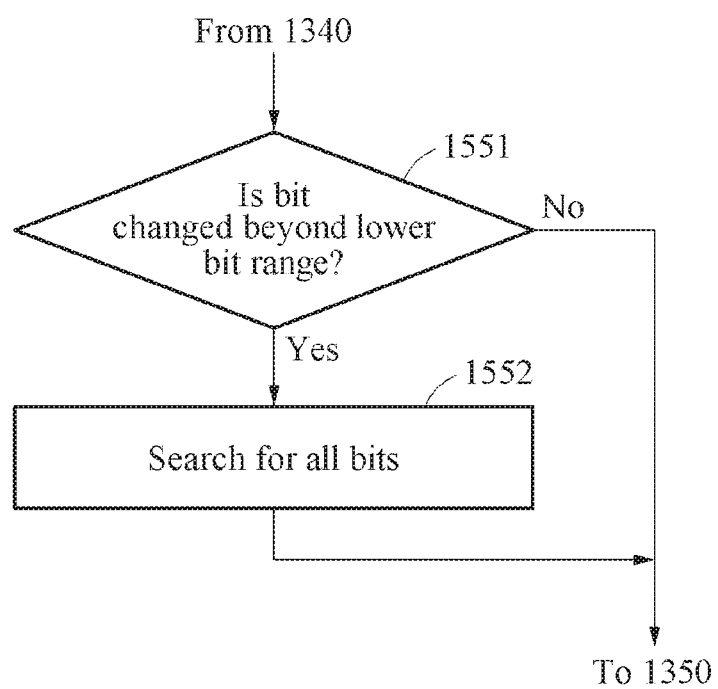
FIG. 15 is a flowchart illustrating another example of the analog-to-digital conversion method of FIG. 13, in accordance with one or more embodiments.

FIG. 15 illustrates another example of the analog-to-digital conversion method of FIG. 13.

Referring to FIG. 15, in operation 1551, the controller determines whether a bit is changed beyond the lower bit range. For example, in response to capacitor cells corresponding to the lower bit range in the DAC indicating a minimum value or a maximum value, the controller determines that a value corresponding to the analog input exceeds the lower bit range. For example, the minimum value represents a bit value "00 . . . 00" and the maximum value represents a bit value "11 . . . 11."

When the bit is determined to be changed beyond the lower bit range, the controller searches for all bits in operation 1552. In response to the value corresponding to the analog input signal exceeding the lower bit range, the controller sequentially generates control signals to adjust capacitor cells of the DAC from an MSB of the upper bit range to an LSB of the lower bit range.

When the bit is determined to be changed within the lower bit range, the controller generates a digital output through a capacitor adjustment described with reference to FIGS. 1 through 14.

The ADC initializes capacitors designated in the previous analog-to-digital conversion cycle among capacitors corresponding to the upper bit range after initializing capacitors corresponding to the lower bit range and sampling an input signal (for example, after input terminals and the DAC are disconnected), as described above with reference to FIG. 14. The ADC adjusts a conversion voltage to a voltage corresponding to bits designated in the previous analog-to-digital conversion cycle in a more efficient manner with less power and operating time, by initializing a portion of the capacitors corresponding to the upper bit range. An operation of searching for all bits when it is difficult to represent a value of a differential signal using only a capacitor corresponding to the lower bit range has been described above with reference to FIG. 15 in association with the example of FIG. 14.

However, examples are not limited thereto, and the ADC may sequentially adjust capacitors for all bits every analog-to-digital conversion cycle. FIGS. 16A through 16J illustrate examples of a process of sequentially controlling all bits. Although the connection state of the second capacitor group (for example, a lower capacitor group) is omitted in FIG. 14, FIGS. 16A through 16J illustrate connection states of both the first capacitor group (for example, the upper capacitor group) and the second capacitor group (for example, the lower capacitor group).

FIGS. 16A through 16J illustrate examples of a process of controlling capacitor cells of a DAC included in an ADC.

FIGS. 16A through 16J illustrate sequential adjustment of capacitor cells in the DAC and timing of signals associated with the DAC. FIGS. 16A through 16E and 16J illustrate examples of a DAC in the forward connection of FIG. 11. FIGS. 16F through 16I illustrate examples of a DAC in the reverse connection of FIG. 12.

Figure 16A:
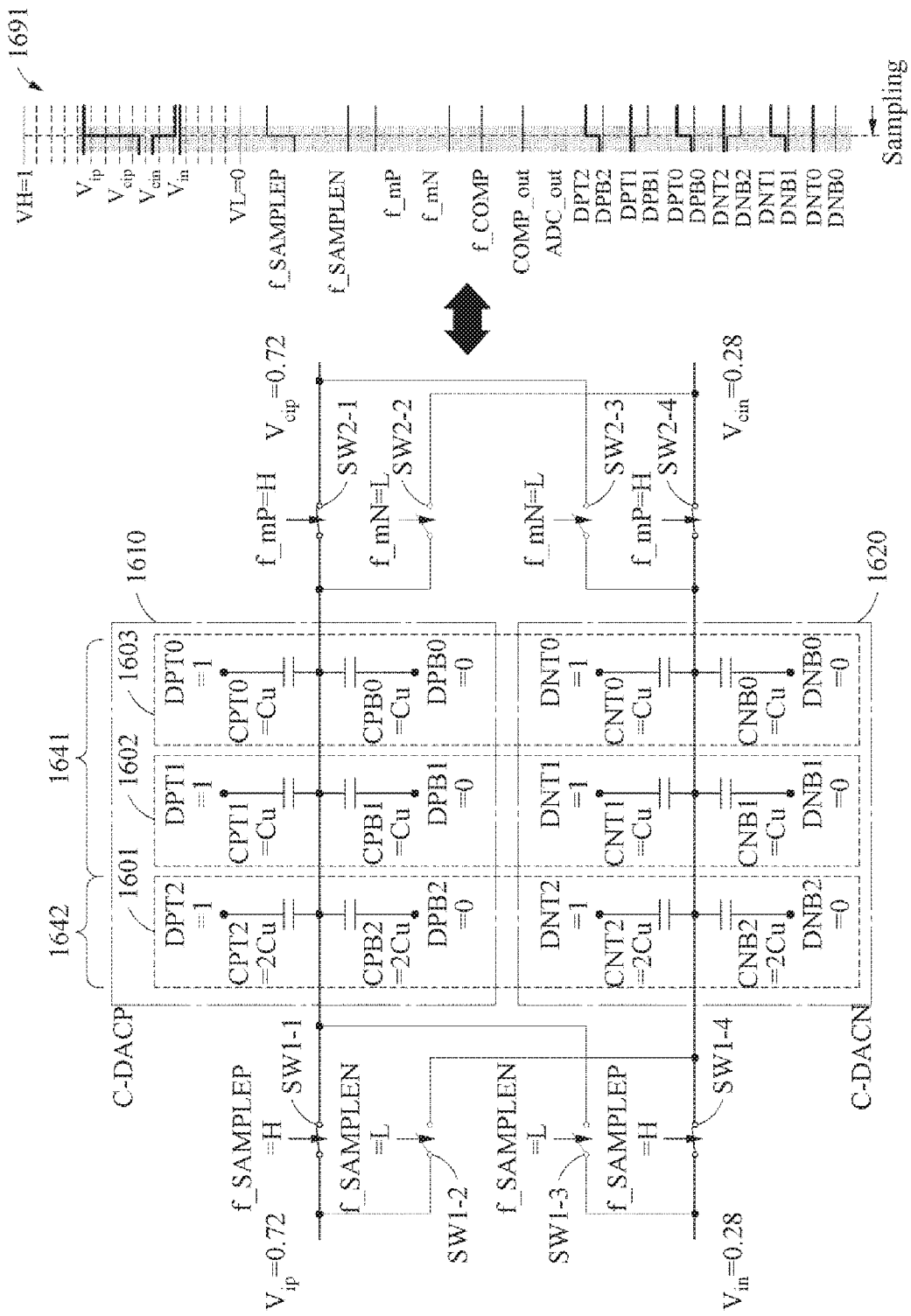
Figure 16B:
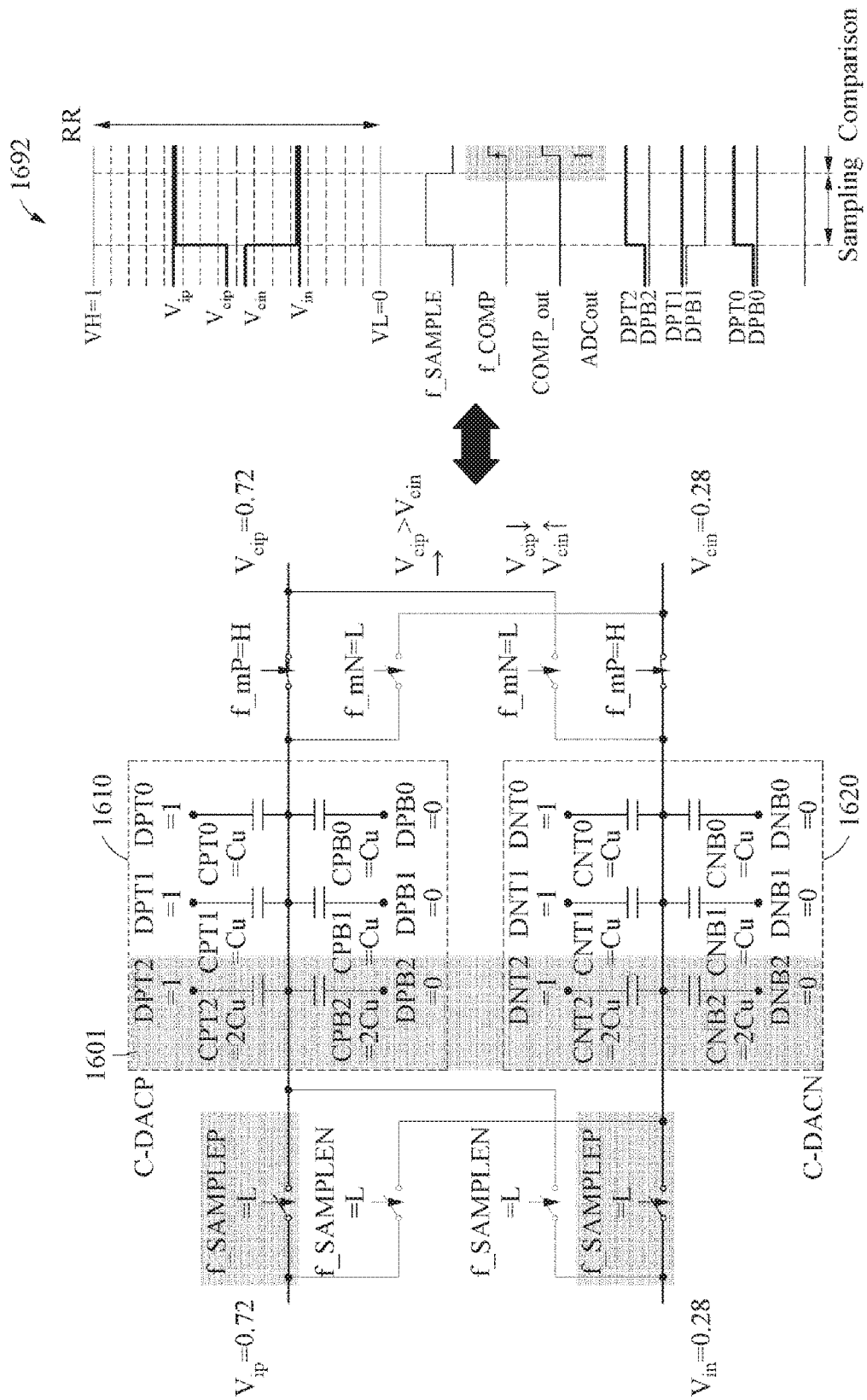
Figure 16C:
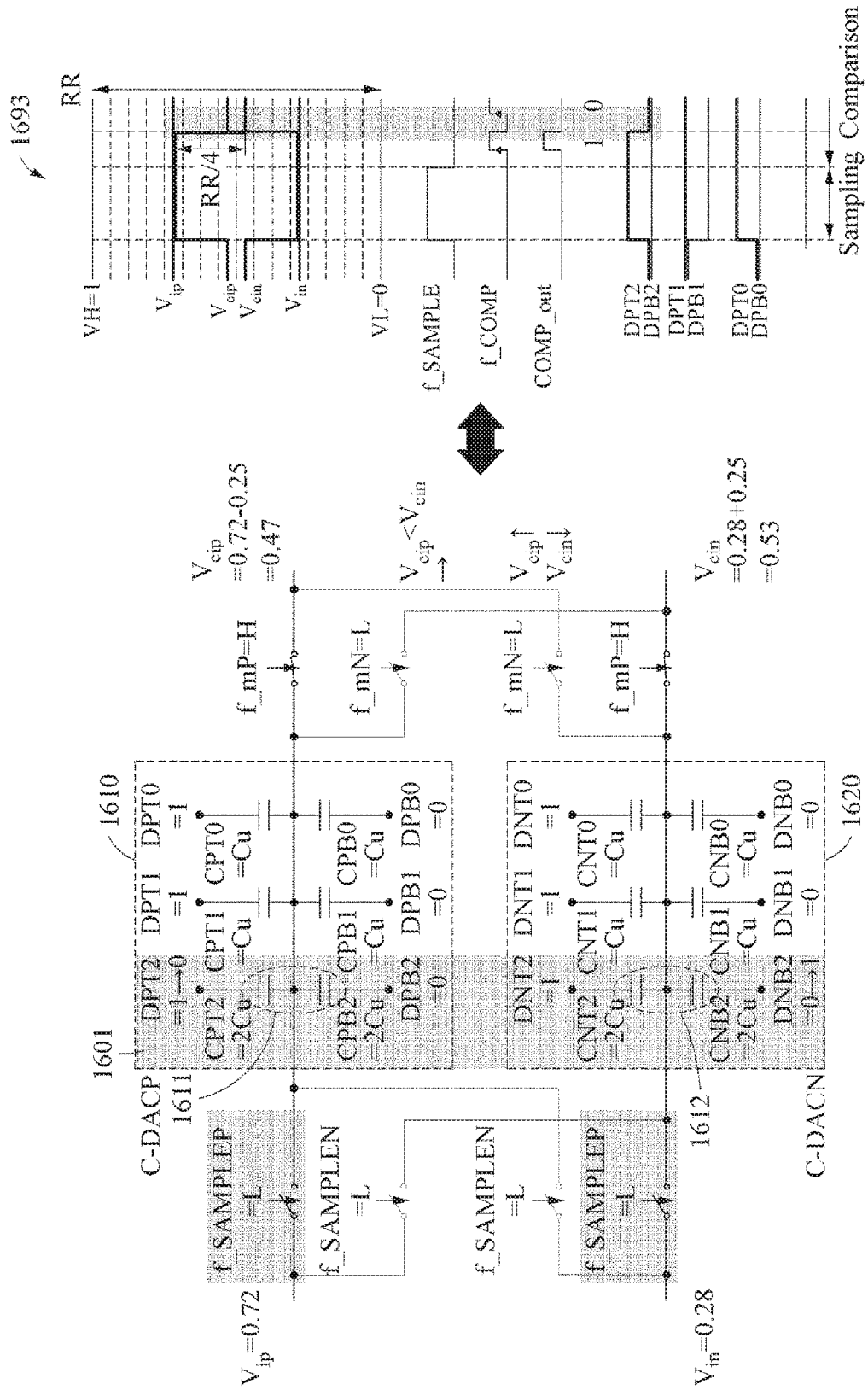
Figure 16D:
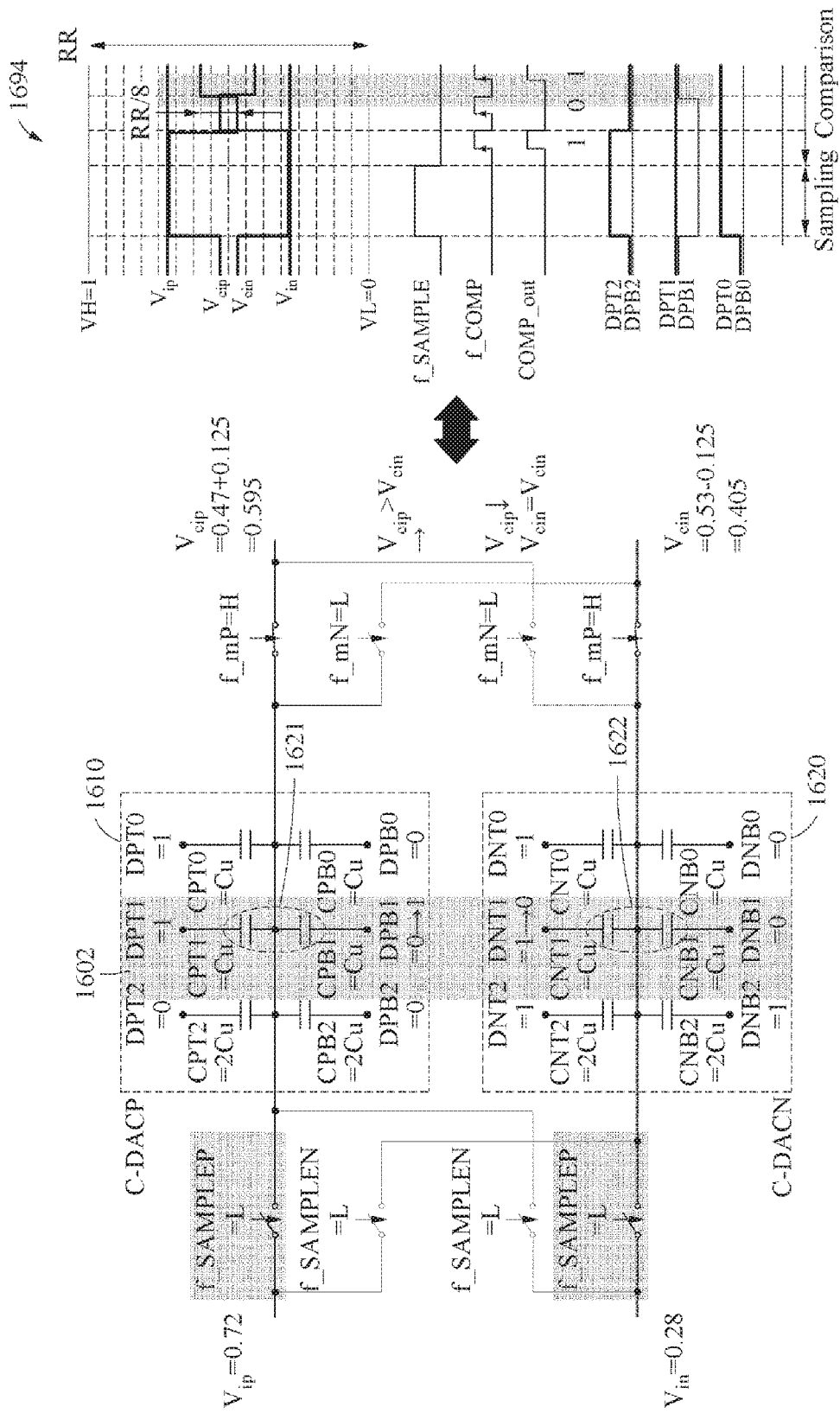
Figure 16E:
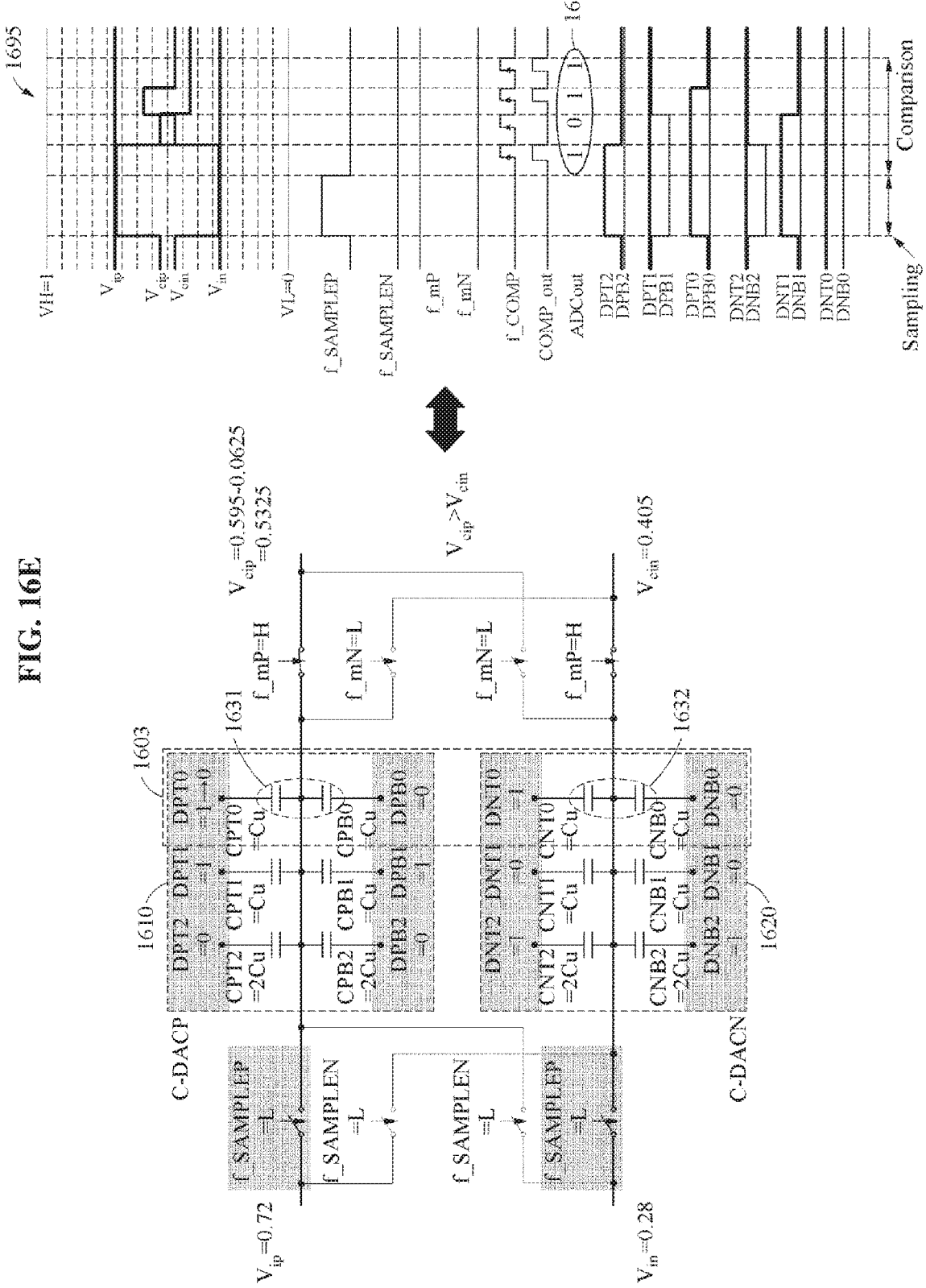
Figure 16F:
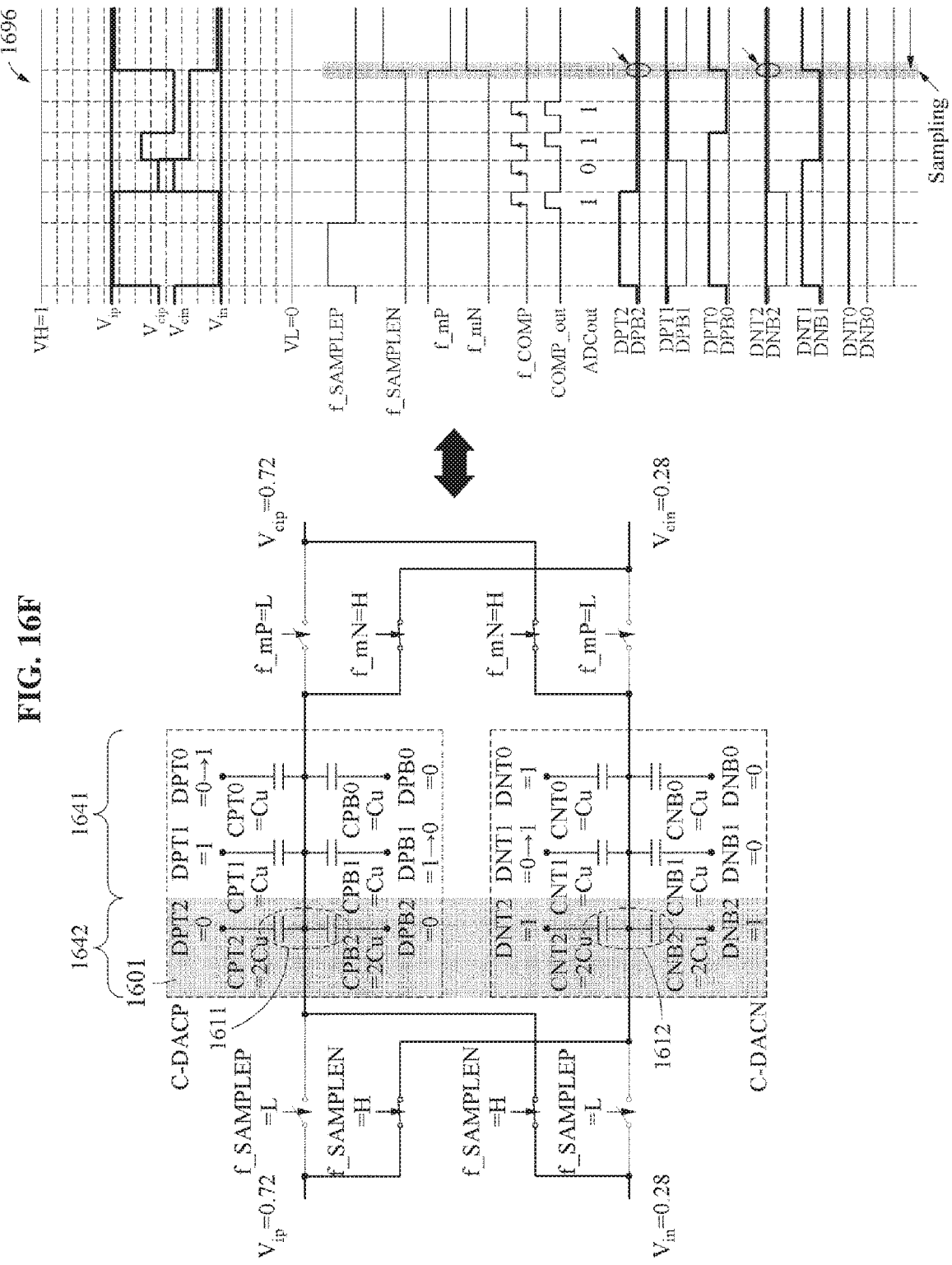

Referring to FIGS. 16A through 16J, f_SAMPLEP indicates a first switch signal for the forward connection, and f_SAMPLEN indicates a first switch signal for the reverse connection. As shown in FIGS. 16A through 16J, the first switch 511 of FIG. 5 may include four switch elements, for example, switch elements SW1-1, SW1-2, SW1-3 and SW1-4. The switch elements SW1-1 and SW1-4 operate in response to f_SAMPLEP. For example, in response to a logical value of f_SAMPLEP being "H," both ends in each of the switch elements SW1-1 and SW1-4 are connected. In response to the logical value of f_SAMPLEP being "L," both ends in each of the switch elements SW1-1 and SW1-4 are disconnected. The switch elements SW1-2 and SW1-3 operate in response to f_SAMPLEN. For example, in response to a logical value of f_SAMPLEN being "H," both ends in each of the switch elements SW1-2 and SW1-3 are connected. In response to the logical value of f_SAMPLEN being "L," both ends in each of the switch elements SW1-2 and SW1-3 are disconnected. When the first switch unit 511 operates in a forward connection configuration as shown in FIG. 16A, the logical value of f_SAMPLEP is set to "H" and the logical value of f_SAMPLEN is set to "L." When the first switch 511 operates in a reverse connection configuration as shown in FIG. 16F, the logical value of f_SAMPLEP is set to "L" and the logical value of f_SAMPLEN is set to "H."

In FIGS. 16A through 16J, f_mP indicates a second switch signal for the forward connection, and f_mN indicates a second switch signal for the reverse connection. As shown in FIGS. 16A through 16J, the second switch 512 of FIG. 5 may include four switch elements, for example, switch elements SW2-1, SW2-2, SW2-3 and SW2-4. The switch elements SW2-1 and SW2-4 operate in response to f_mP. For example, in response to a logical value of f_mP being "H," both ends in each of the switch elements SW2-1 and SW2-4 are connected. In response to the logical value of f_mP being "L," both ends in each of the switch elements SW2-1 and SW2-4 are disconnected. The switch elements SW2-2 and SW2-3 operate in response to f_mN. For example, in response to a logical value of f_mN being "H," both ends in each of the switch elements SW2-2 and SW2-3 are connected. In response to the logical value of f_mN being "L," both ends in each of the switch elements S SW2-2 and SW2-3 are disconnected. When the second switch 512 operates in the forward connection configuration as shown in FIG. 16A, the logical value of f_mP is set to "H" and the logical value of f_mN is set to "L." When the second switch unit 512 operates in the reverse connection configuration as shown in FIG. 16F, the logical value of f_mP is set to "L" and the logical value of f_mN is set to "H."

Referring to FIGS. 16A through 16J, Vip indicates a first differential signal (e.g., a voltage signal), and Vin indicates a second differential signal (e.g., a voltage signal). Vcip indicates a first conversion voltage as a voltage of a node connected to a positive input end of each of the comparators 1131 and 1231. Vcin indicates a second conversion voltage as a voltage of a node connected to a negative input end of each of the comparators 1131 and 1231.

With continued reference to FIGS. 16A through 16, Cu indicates a basic capacitance. A capacitor included in a DAC including a first capacitor group 1610 and a second capacitor group 1620 has a capacitance that is an integer multiple of the basic capacitance. CPTj indicates one capacitor of a capacitor pair corresponding to a j-th bit of the first capacitor group 1610 and receives a control signal DPTj, and CPBj indicates the other capacitor of the capacitor pair corresponding to the j-th bit of the first capacitor group 1610 and receives a control signal DPBj. CNTj, as one capacitor of a capacitor pair corresponding to a j-th bit of the second capacitor group 1620, is connected to a control signal DNTj, and CNBj, as the other capacitor of the capacitor pair corresponding to the j-th bit of the second capacitor group 1620, is connected to a control signal DNBj. In this example, j is an integer greater than or equal to "0."

Additionally, in FIG. 16A, a reset of capacitors corresponding to an upper bit range 1642 among a plurality of capacitors is skipped. Although the upper bit range 1642 is a range including a plurality of bits, FIGS. 16A through 16J illustrate the upper bit range 1642 including only an MSB for convenience of description. Capacitors corresponding to a lower bit range 1641 among the plurality of capacitors are capacitors corresponding to bits other than bits belonging to the upper bit range 1642, and a reset in an analog-to-digital conversion operation is applied to the capacitors corresponding to the lower bit range 1641. FIG. 16A illustrates a capacitor cell 1601 corresponding to the MSB, a capacitor cell 1602 corresponding to a bit subsequent to the MSB, and a capacitor cell 1603 corresponding to a bit subsequent to the bit that is subsequent to the MSB.

In the following description, the ADC adjusts a capacitor cell of the DAC and minimizes a difference between the first conversion voltage Vcip and the second conversion voltage Vcin, to acquire a digital output signal corresponding to a difference between the voltage Vip of the first differential signal and the voltage Vin of the second differential signal.

FIG. 16A illustrates an example of a state in which all the capacitor cells of the DAC are initialized in the forward connection state. A state in which a capacitor cell is initialized is, for example, a state in which one end of one capacitor of a capacitor pair is connected to a first power source (for example, a power source corresponding to a bit "1"), and one end of the other capacitor is connected to a second power source (for example, a power source corresponding to a bit "0") as described above with reference to FIGS. 6A and 6B. In FIG. 16A, the first switch signal f_SAMPLEP and the second switch signal f_mP for the forward connection have logical values of "H" and are applied to a first switch (for example, first switch 511 in FIG. 5) and a second switch (for example, second switch 512 in FIG. 5), respectively. For example, the DAC samples the first differential signal Vip to the first capacitor group 1610 and samples the second differential signal Vin to the second capacitor group 1620. In this example, the first differential signal Vip and the second differential signal Vin are assumed to be 0.72 V and 0.28 V, respectively. However, this is only an example, and Vin and Vip may be configured to have different values. Thus, the first conversion voltage Vcip of 0.72 V and the second conversion voltage Vin of 0.28 V are output. A timing diagram 1691 of FIG. 16A illustrates a value of each of the signals during sampling. By the sampling, the first conversion voltage Vcip and the second conversion voltage Vcin are adjusted to the first differential signal Vip and the second differential signal Vin, respectively.

Although reference numerals of FIG. 16A are partially omitted in FIGS. 16B through 16I, the same reference numeral is assigned to the same component regardless of reference numerals.

FIG. 16B illustrates an example of an operation of a comparator to compare the first conversion voltage Vcip and the second conversion voltage Vcin. For example, to adjust control signals DPT2, DPB2, DNT2 and DNB2 supplied to a capacitor cell 1601 corresponding to an upper bit range, the DAC compares the first conversion voltage Vcip and the second conversion voltage Vcin. In FIG. 16B, the upper bit range includes an MSB. Because the first conversion voltage Vcip of 0.72 V is greater than the second conversion voltage Vcin of 0.28 V in the above example, the DAC adjusts a capacitor cell corresponding to an upper bit range as shown in FIG. 16C to increase the second conversion voltage Vcin while reducing the first conversion voltage Vcip. A timing diagram 1692 of FIG. 16B illustrates a comparison signal COMP_out output by the comparator based on a comparison between the first conversion voltage Vcip and the second conversion voltage Vcin after sampling. In response to the first conversion voltage Vcip being greater than the second conversion voltage Vcin, the comparator outputs a comparison signal COMP_out corresponding to "1."

FIG. 16C illustrates an example of an operation of a controller to change a voltage supplied to the capacitor cell 1601 corresponding to the upper bit range (for example, an MSB in FIG. 16C) in response to the above-described comparison signal COMP_out. In response to the comparison signal COMP_out of FIG. 16B, the DAC adjusts the capacitor cell 1601 corresponding to the MSB. For example, to reduce the first conversion voltage Vcip, the controller connects one end of a first capacitor pair 1611 in the capacitor cell 1601 corresponding to the MSB to a second power source. For convenience of description, FIG. 16C illustrates a change in a digital value corresponding to DPT2 from "1" to "0." Also, to increase the second conversion voltage Vcin, the controller connects one end of a second capacitor pair 1612 in the capacitor cell 1601 corresponding to the MSB to a first power source. For convenience of description, FIG. 16C illustrates a change in a digital value corresponding to DNB2 from "0" to "1". In FIG. 16C, a variation of a voltage assigned to each capacitor in the capacitor cell 1601 corresponding to the MSB may be 0.25 V. Thus, the first conversion voltage Vcip is equal to 0.47 V based on the relation "0.72−0.25" and the second conversion voltage Vcin is equal to 0.53 V based on the relation "0.28+0.25." Because the first conversion voltage Vcip is less than the second conversion voltage Vcin, the comparator outputs "0" as a comparison signal COMP_out as shown in a timing diagram 1693. In FIG. 16D, the controller adjusts a capacitor cell corresponding to a bit subsequent to the MSB, to increase the first conversion voltage Vcip and to reduce the second conversion voltage Vcin. The bit subsequent to the MSB belongs to, for example, a lower bit range.

FIG. 16D illustrates an example of an operation of the controller to adjust a voltage supplied to the capacitor cell 1602 corresponding to a bit subsequent to the MSB in response to the comparison signal COMP_out generated in FIG. 16C. For example, to increase the first conversion voltage Vcip, the controller connects one end of a first capacitor pair 1621 in the capacitor cell 1602 to a first power source. For convenience of description, FIG. 16D illustrates a change in a digital value corresponding to DPB1 from "0" to "1." Also, to reduce the second conversion voltage Vcin, the controller connects one end of a second capacitor pair 1622 in the capacitor cell 1602 to a second power source. For convenience of description, FIG. 16D illustrates a change in a digital value corresponding to DNT1 from "1" to "0." In FIG. 16D, a voltage of 0.125 V may be assigned to each capacitor in the capacitor cell 1602 corresponding to a next bit (for example, a bit subsequent to the MSB). Thus, the first conversion voltage Vcip is equal to 0.595 V based on the relation "0.47+0.125" and the second conversion voltage Vcin is equal to 0.405 V based on the relation "0.53−0.125." Since the first conversion voltage Vcip is greater than the second conversion voltage Vcin, the comparator outputs "1" as a comparison signal COMP_out as shown in a timing diagram 1694. In FIG. 16E, to reduce the first conversion voltage Vcip, the controller adjusts a capacitor cell corresponding to a bit subsequent to the bit. The bit subsequent to the bit belongs to, for example, a lower bit range, and corresponds to an LSB in the lower bit range.

FIG. 16E illustrates an example of an operation of the controller to adjust a voltage supplied to the capacitor cell 1603 corresponding to a bit subsequent to the bit of FIG. 16D in response to the comparison signal COMP_out generated in FIG. 16D. For example, to reduce the first conversion voltage Vcip, the controller connects one end of a first capacitor pair 1631 in the capacitor cell 1603 to the second power source. For convenience of description, FIG. 16E illustrates a change in a digital value corresponding to DPT0 from "1" to "0."

The ADC determines a differential signal through a binary search, and thus a conversion voltage should be changed by half of a variation in a voltage in an upper bit. Thus, in FIG. 16E, the controller adjusts the first capacitor pair 1631 and skips an adjustment of a second capacitor pair 1632.

In FIG. 16E, a voltage of 0.0625 V is may be assigned to each capacitor in the capacitor cell 1603. Thus, the first conversion voltage Vcip is equal to 0.5325 V based on the relation "0.595-0.0625." Since the first conversion voltage Vcip is greater than the second conversion voltage Vcin, the comparator outputs "1" as a comparison signal COMP_out as shown in a timing diagram 1695. An adjustment of capacitor cells for all bits is completed, and accordingly the controller generates a last control signal as an output signal ADC_out 1609. The last control signal is represented as a sequence of comparison signals that are sequentially output. In FIG. 16E, the controller outputs "1011" as the output signal ADC_out 1609.

In the above example, the ADC operates in a successive approximation cycle in which N is "4." A control signal is represented as a 4-bit digital code. For example, when a maximum voltage VH is 1 V and a minimum voltage VL is 0 V, an analog estimated value corresponding to "1011" that is a value of the output signal ADC_out 1609 is calculated as 0.46 V=("1011"/"1111"×2−1). The analog estimated value is an approximate value corresponding to a differential analog input 0.44 V=0.72 V−0.28 V. When a bit number supported by the DAC increases, an error of the analog estimated value decreases.

A relationship between an output digital code and a differential analog input is described below. For example, when the DAC is designed to have a maximum voltage of 1 V and a minimum voltage of 0 V, when Vip is 1 V that is the maximum voltage and when $V_{in}$ is 0 V that is the minimum voltage, an output digital code is "1111." "1111" as a binary number which corresponds to "15" as a decimal number. When Vip is 0 V and when $V_{in}$ is 1 V, the output digital code is "0000" which corresponds to "0" as a decimal number. Thus, assuming that X denotes a value obtained by converting a binary value of an output digital code to a decimal number and Y denotes a differential analog input, a relationship of "Y=2*X/15−1" is satisfied.

The operations of the ADC in the forward connection state have been described above with reference to FIGS. 16A through 16E. When the output signal ADC_out 1609 is generated in the forward connection state, the ADC changes a path by changing a node of the DAC connected to input terminals and nodes of the controller. Operations of the ADC in the reverse connection state will be described below with reference to FIG. 16F through FIG. 16I.

In FIG. 16F, the ADC in the reverse connection state may maintain a connection of capacitors of the capacitor cell 1601 corresponding to the upper bit range 1642 among capacitor cells of the DAC, and initialize a connection of capacitors of a capacitor cell corresponding to the other lower bit range 1641. For example, in FIG. 16F, a state in which one end of the first capacitor pair 1611 in the capacitor cell 1601 corresponding to the upper bit range 1642 is connected to the second power source (for example, a power source corresponding to a bit "0") is maintained similarly to FIG. 16E. A state in which one end of the second capacitor pair 1612 in the capacitor cell 1601 corresponding to the upper bit range 1642 is connected to the first power source (for example, a power source corresponding to a bit "1") is maintained similarly to FIG. 16E. The capacitor cell corresponding to the other lower bit range 1641 is initialized. An initialization operation of FIG. 16F is an operation of setting DPT1=DPT0=1, DPB1=DPB0=0, DNT1=DNT0=1 and DNB1=DNB0=0, similarly to those of FIGS. 6A and 6B. The ADC samples the first differential signal Vip and the second differential signal $V_{in}$ while maintaining the connection of the capacitor cell 1601 corresponding to the upper bit range 1642. Thus, the first conversion voltage Vcip and the second conversion voltage Vcin are adjusted by the first differential signal Vip and the second differential signal $V_{in}$, respectively, as shown in a timing diagram 1696. The ADC skips a comparison operation and a reset operation for the upper bit range in FIG. 16F, and adjusts a capacitor cell corresponding to the upper bit range, which will be described below with reference to FIG. 16G.

FIG. 16G illustrates an example of an operation of the ADC to adjust a capacitor cell corresponding to an upper bit range. For example, the ADC initializes a connection state of the capacitor cell 1601 corresponding to the MSB. An initialization operation of FIG. 16G is an operation of setting DPT2=1, DPB2=0, DNT2=1 and DNB2=0 similarly to those of FIGS. 6A and 6B. By a connection configuration of the first switch (for example the first switch 511 in FIG. 5) and the second switch (for example, the second switch 512 in FIG. 5) and an operation of initializing a capacitor cell corresponding to the MSB, the first conversion voltage Vcip is adjusted to 0.72−0.25=0.47 V, and the second conversion voltage Vcin is adjusted to 0.28+0.25=0.53 V. Conversion voltages based on an adjustment of the capacitor cell 1601 corresponding to the MSB in FIG. 16G are equal to conversion voltages based on an adjustment of the capacitor cell 1601 corresponding to the MSB in FIG. 16C. Thus, the ADC adjusts the capacitor cell corresponding to the upper bit range by a conversion voltage corresponding to a control signal "1" associated with the upper bit range in a previous analog-to-digital conversion cycle even though the comparison operation and the reset operation for the upper bit range are skipped in FIG. 16F. In a timing diagram 1697, a comparison signal COMP_OUT for the upper bit range (for example, the MSB) is skipped.

When the capacitor cell 1601 corresponding to the MSB is adjusted, the comparator compares the first conversion voltage Vcip and the second conversion voltage Vcin. Because the first conversion voltage Vcip is less than the second conversion voltage Vcin, the comparator generates a comparison signal COMP_out corresponding to "0." The controller adjusts the capacitor cell 1602 corresponding to a bit subsequent to the MSB in response to the comparison signal COMP_out, which will be described with reference to FIG. 16H. The capacitor cell 1602 belongs to, for example, the lower bit range.

Figure 16H:
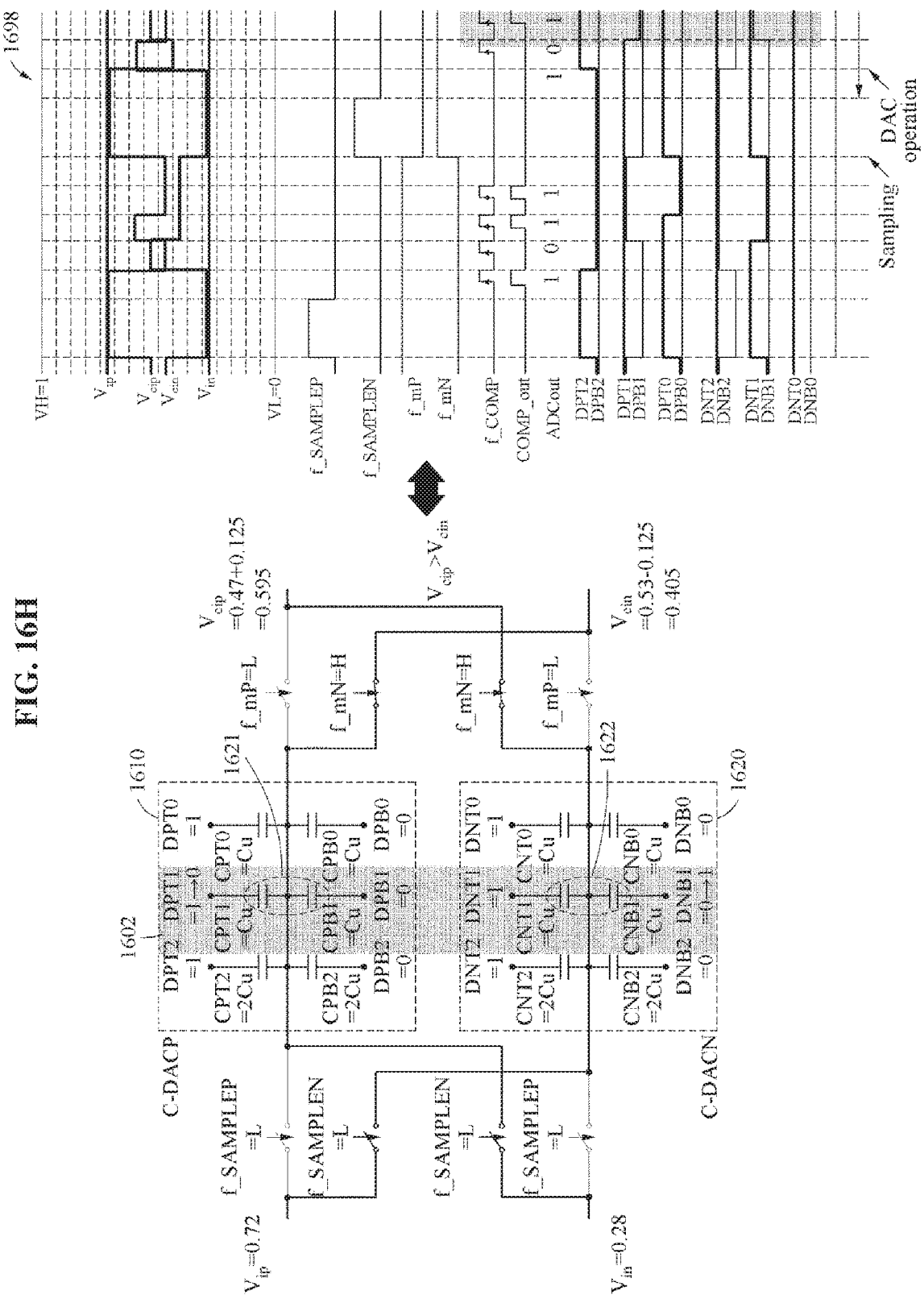

FIG. 16H illustrates an example of an operation of the ADC to adjust the capacitor cell 1602 corresponding to the bit subsequent to the MSB. For example, because the first conversion voltage Vcip is less than the second conversion voltage Vcin in FIG. 16G, the controller increases the first conversion voltage Vcip and reduces the second conversion voltage Vcin. To increase the first conversion voltage Vcip, the controller connects one end of the second capacitor pair 1622 in the capacitor cell 1602 to the first power source. In FIG. 16H, a digital value corresponding to DNB1 is changed from "0" to "1." Also, to reduce the second conversion voltage Vcin, the controller connects one end of the first capacitor pair 1621 in the capacitor cell 1602 to the second power source. In FIG. 16H, a digital value corresponding to DPT1 is changed from "1" to "0." Accordingly, the first conversion voltage Vcip is equal to 0.595 V based on the relation "0.47+0.125" and the second conversion voltage Vcin is equal to 0.405 V based on the relation "0.53−0.125." Since the first conversion voltage Vcip is greater than the second conversion voltage Vcin, the comparator outputs "1" as a comparison signal COMP_out as shown in a timing diagram 1698. The controller adjusts the capacitor cell 1603 corresponding to a bit subsequent to the previous bit to reduce the first conversion voltage Vcip, which will be described below with reference to FIG. 16I. The bit subsequent to the previous bit is a part of, for example, the lower bit range, and corresponds to an LSB in the lower bit range.

Figure 16I:
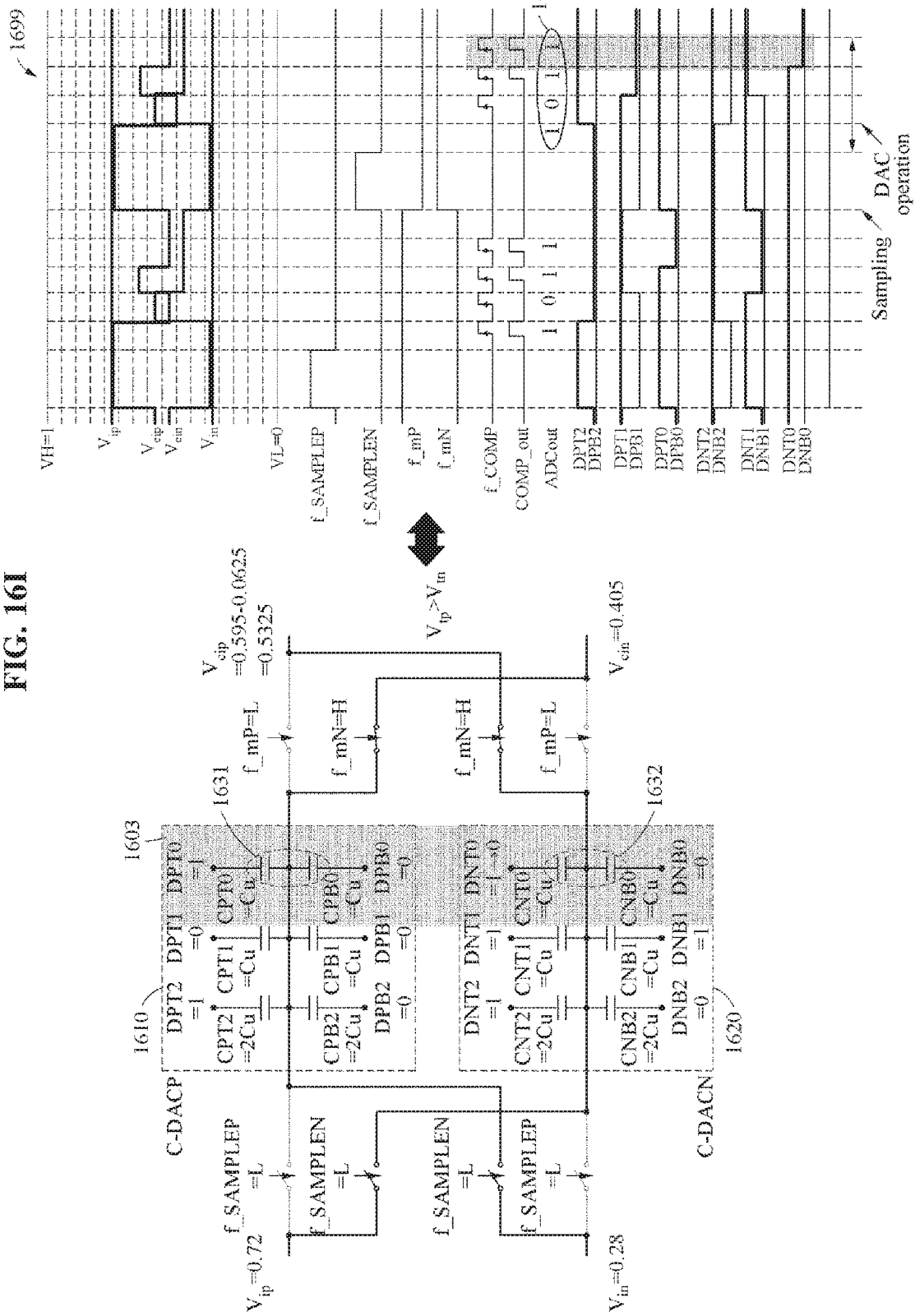

FIG. 16I illustrates an example of an operation of the controller to adjust a voltage supplied to the capacitor cell 1603 corresponding to a bit subsequent to the previous bit in response to the comparison signal COMP_out generated in FIG. 16H. For example, to reduce the first conversion voltage Vcip, the controller connects one end of a second capacitor pair 1632 in the capacitor cell 1603 to the second power source. In FIG. 16I, a digital value corresponding to DNT0 is changed from "1" to "0." Thus, the first conversion voltage Vcip is equal to 0.5325 V based on the relation "0.595-0.0625." Since the first conversion voltage Vcip is greater than the second conversion voltage Vcin, the comparator outputs "1" as a comparison signal COMP_out as shown in a timing diagram 1699. An adjustment of capacitor cells for all bits is completed, and accordingly the controller generates a last control signal as an output signal ADC_out 1609. The ADC samples the same differential signal value as that of FIG. 16E for the forward connection, and thus "1011" as the output signal ADC_out 1609 is output similarly to FIG. 16E.

Figure 16J:
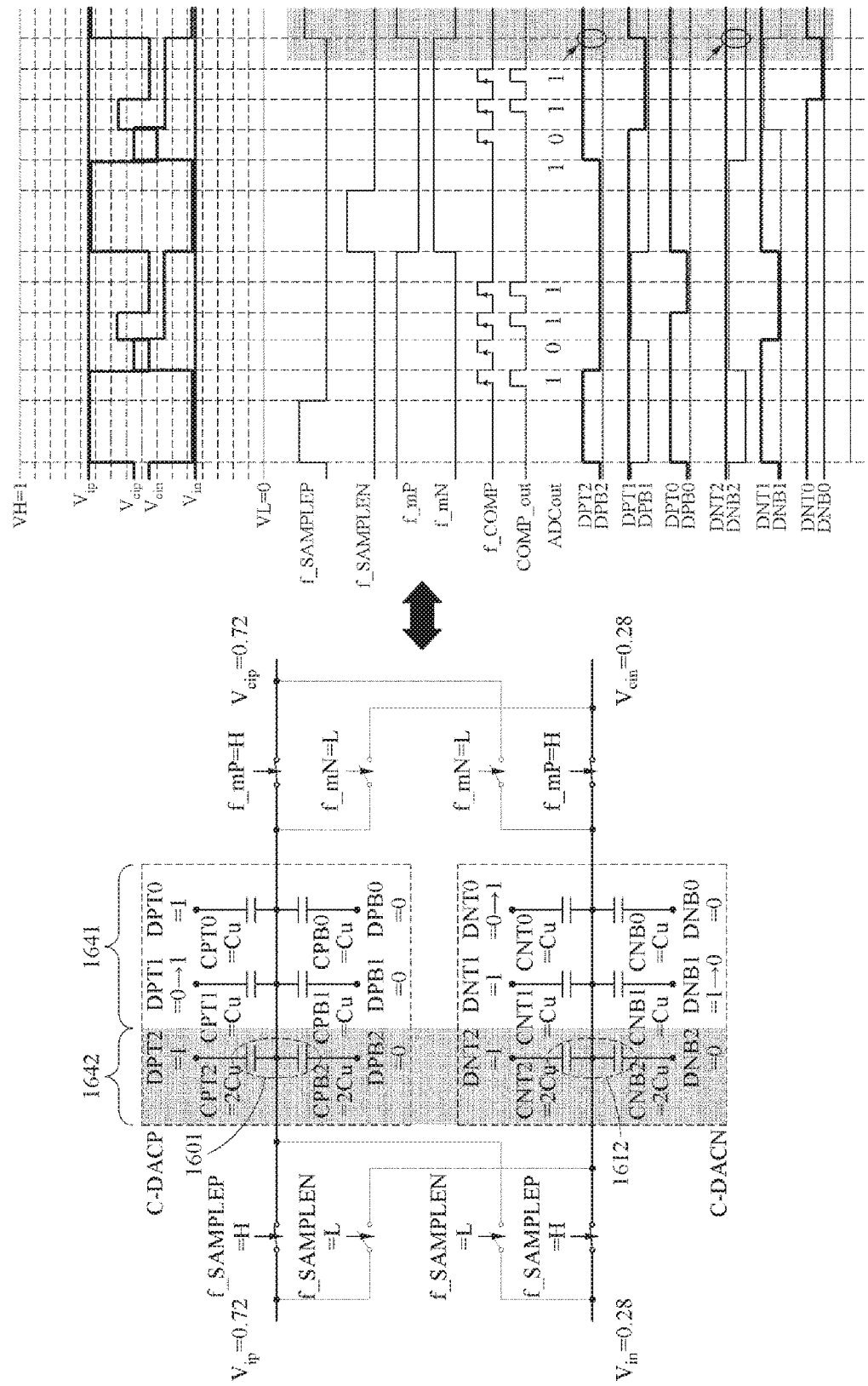

FIG. 16J illustrates capacitor cells in the same state as the capacitor cells of FIG. 16A. After FIG. 16I, the ADC initializes a capacitor cell corresponding to the lower bit range 1641 while maintaining a connection to the capacitor cell 1601 corresponding to the upper bit range 1642. FIG. 16G illustrates a connection state in which the capacitor cell 1601 corresponding to the upper bit range 1642 is initialized without an additional initialization operation because the capacitor cell 1601 corresponding to the upper bit range 1642 is adjusted. Thus, the ADC outputs a digital value of a differential signal by alternately changing paths instead of performing an additional reset operation or initialization operation of the capacitor cell 1601 corresponding to the upper bit range 1642. The ADC performs a sampling operation and repeatedly performs the operations of FIGS. 16B through 16J after the sampling operation.

Figure 17:
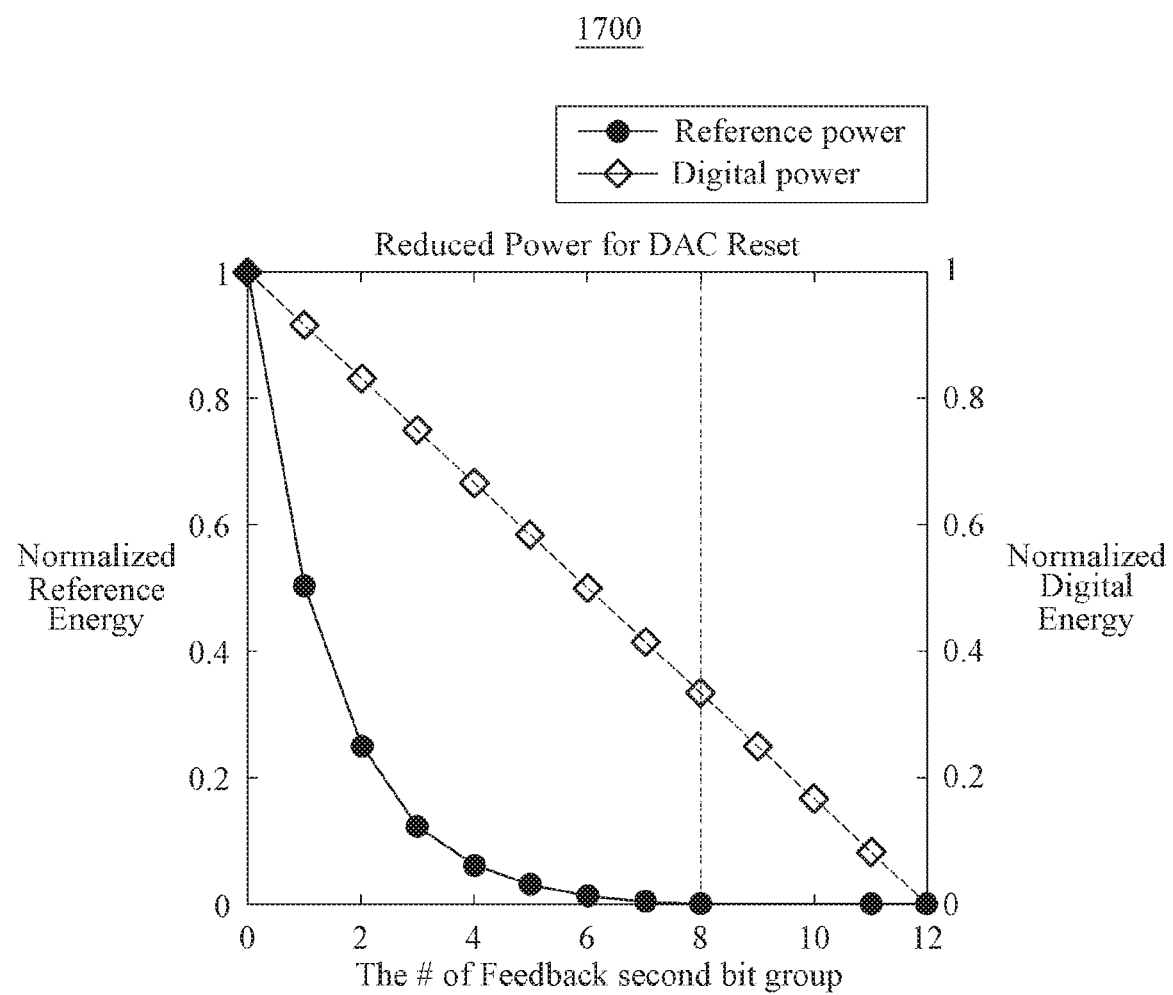
FIG. 17 illustrates an example of a power consumption of an ADC, in accordance with one or more embodiments.

FIG. 17 illustrates an example of a power consumption of an ADC.

FIG. 17 illustrates a power consumption reduction ratio of an ADC to which a reset skip technique is applied. In a graph 1700 of FIG. 17, a horizontal axis represents a number of bits in a second bit group for which a reset is skipped, and a vertical axis represents a power consumption reduction ratio based on the number of bits. When a number of bits for which a reset is skipped increases, a reference power consumed in a DAC and a digital power consumed in a controller decrease.

According to examples, an ADC may be applicable to a low-power system configured to measure a biosignal, but is not so limited. Also, the ADC may be implemented as a chip with another system and may be mounted in a healthcare product. Furthermore, the ADC may be easily implemented because a complex hardware design change is not required when the ADC is applied to a system.

In addition, an example in which a differential signal is a signal with a difference in time has been mainly described with reference to FIGS. 1 through 17, however, examples are not limited thereto. For example, the ADC approximates a signal with a small difference between measurement samples to a digital output. Thus, it is possible to process different types of biosignals and also possible to apply the ADC to an image signal sensing and conversion apparatus.

The ADC 110, the path switching circuit 510, the first switch 511, the second switch 512, the DAC 520, the controller 530, the comparator 531, the control element 532 described herein with respect to FIGS. 1 and 5, and that perform operations described in this application, are implemented as and by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-17 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations performed by the hardware components and the methods as described above.

The instructions or software to control computing hardware, for example, one or more processors or computers to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-to-digital converter (ADC) comprising:
an input terminal configured to receive input signals;
a digital-to-analog converter (DAC);
a first switch configured to control a connection between the DAC and the input terminal;
a comparator;
a second switch configured to control a connection between the DAC and the comparator; and
a controller configured to control the first switch, the second switch, the DAC and the comparator.

2. The ADC of claim 1, wherein
the input terminal comprises a first input terminal configured to receive a first input signal, and a second input terminal configured to receive a second input signal,
the DAC comprises a first capacitor group comprising a first set of capacitors connected to a first common node and a first control input terminal configured to receive digital control signals, and a second capacitor group comprising a second set of capacitors connected to a second common node and a second control input terminal configured to receive the digital control signals, and the comparator comprises a positive input end and a negative input end.

3. The ADC of claim 2, wherein the first switch is configured to connect the DAC to the input terminal during sampling of the input signals, and is configured to disconnect the DAC from the input terminal in response to a termination of the sampling.

4. The ADC of claim 2, wherein
the first capacitor group comprises a first capacitor control switch configured to control a voltage applied to a capacitor of the first set of capacitors corresponding to each bit in response to the digital control signals, and
the second capacitor group comprises a second capacitor control switch configured to control a voltage applied to a capacitor of the second set of capacitors corresponding to each bit in response to the digital control signals.

5. The ADC of claim 2, wherein
the first switch is configured to maintain a disconnection state between the first input terminal and the second common node, and maintain a disconnection state between the second input terminal and the first common node, during a first connection configuration state, and
the second switch is configured to maintain a disconnection state between the first common node and the negative input end, and maintain a disconnection state between the second common node and the positive input end, during the first connection configuration state.

6. The ADC of claim 5, wherein
the first switch is configured to maintain a disconnection state between the first input terminal and the first common node, and maintain a disconnection state between the second input terminal and the second common node, during a second connection configuration state, and
the second switch is configured to maintain a disconnection state between the first common node and the positive input end, and maintain a disconnection state between the second common node and the negative input end, during the second connection configuration state.

7. The ADC of claim 6, wherein the ADC is configured to alternately switch the first connection configuration state and the second connection configuration state.

8. The ADC of claim 1, wherein the DAC comprises a plurality of capacitor cells corresponding to a first bit range and a second bit range, and the DAC is configured to adjust a voltage supplied to one end of a capacitor cell corresponding to a digital control signal received from the controller within the first bit range.

9. The ADC of claim 8, wherein
the first bit range is a lower bit range comprising a least significant bit (LSB) to an m-th bit,
the second bit range is an upper bit range comprising an (m+1)-th bit to a most significant bit (MSB), and
m is an integer between the LSB and the MSB.

10. The ADC of claim 9, wherein the controller is configured to generate a digital control signal to change a voltage supplied to one end of a capacitor cell corresponding to each bit, sequentially from an MSB to the LSB within the lower bit range.

11. The ADC of claim 9, wherein the DAC is configured to sample an input signal for a current analog-to-digital conversion cycle while maintaining a connection in a previous analog-to-digital conversion cycle of a capacitor cell corresponding to the upper bit range.

12. The ADC of claim 11, wherein the DAC is configured to initialize a capacitor cell corresponding to the lower bit range and is further configured to sample the input signal.

13. The ADC of claim 12, wherein the DAC is configured to connect a first power source to one end of a first capacitor of a capacitor pair in the capacitor cell corresponding to the lower bit range, and to connect a second power source to one end of a second capacitor of the capacitor pair, to initialize the capacitor cell corresponding to the lower bit range.

14. The ADC of claim 9, wherein the DAC is configured to set a value of a control signal assigned to a capacitor cell corresponding to the upper bit range to an initially set value, in response to an initialization of a capacitor cell corresponding to the lower bit range, and the input terminal and the DAC being disconnected during a second connection configuration state of a first connection configuration state and the second connection configuration state.

15. The ADC of claim 8, wherein the controller is configured to generate a digital output corresponding to each of one or more connection states of the plurality of capacitor cells in response to a termination of an adjustment of voltages of the plurality of capacitor cells.

16. The ADC of claim 1, wherein the comparator is configured to generate a comparison signal based on a result of a comparison between a first conversion voltage received from the DAC and a second conversion voltage received from the DAC.

17. The ADC of claim 16, wherein
the comparator is configured to generate the comparison signal for each bit in a descending order of bits within a lower bit range during a current analog-to-digital conversion cycle, and
the controller is configured to generate a digital control signal to determine whether to change a voltage supplied to a capacitor cell corresponding to each bit, based on the comparison signal.

18. The ADC of claim 17, wherein the controller is configured to sequentially generate control signals to adjust capacitor cells of the DAC from an MSB of an upper bit range to an LSB of the lower bit range in response to a value corresponding to the input signal exceeding the lower bit range.

19. The ADC of claim 18, wherein the controller is configured to determine that the value corresponding to the input signal exceeds the lower bit range in response to capacitor cells corresponding to the lower bit range in the DAC indicating a minimum value or a maximum value.

20. An analog-to-digital conversion method comprising:
receiving input signals at an input terminal;
controlling, by a first switch, a connection between a digital-to-analog converter (DAC) and the input terminal;
controlling, by a second switch, a connection between the DAC and a comparator; and
controlling, with a controller, the first switch, the second switch, the DAC and the comparator.

21. An analog-to-digital converter (ADC) comprising:
a digital-to-analog converter (DAC);
a controller;

a path switching circuit configured to alternately change nodes of the DAC connected to the controller and nodes of the DAC connected to one or more input terminals;

wherein the DAC comprises a first capacitor group comprising one or more capacitors connected to a first common node and a first control input terminal, and a second capacitor group comprising one or more capacitors connected to a second common node and a second control input terminal;

wherein the DAC samples an input analog signal and determines a conversion signal based on the analog signal; and wherein the controller adjusts the conversion signal and generates a digital output corresponding to the analog input.

22. The ADC of claim 21, wherein the DAC further comprises a plurality of capacitor cells corresponding to a lower bit range and an upper bit range.

23. The ADC of claim 22, wherein the lower bit range is a range of a least significant bit (LSB) to an m-th bit, and the upper bit range is a range of an (m+1)-th bit to a most significant bit (MSB).

24. An analog-to-digital converter (ADC) comprising:
an input terminal configured to receive input signals; and
a digital-to-analog converter (DAC) comprising a first capacitor group comprising a first set of capacitors connected to a first common node and a first control input terminal configured to receive digital control signals, and a second capacitor group comprising a second set of capacitors connected to a second common node and a second control input terminal configured to receive the digital control signals.

* * * * *